United States Patent
Su et al.

(10) Patent No.: US 12,014,952 B2
(45) Date of Patent: Jun. 18, 2024

(54) LITHOGRAPHY METHOD TO REDUCE SPACING BETWEEN INTERCONNECT WIRES IN INTERCONNECT STRUCTURE

(71) Applicant: Taiwan Semiconductor Manufacturing Company, Ltd., Hsinchu (TW)

(72) Inventors: Yi-Nien Su, Hsinchu (TW); Yu-Yu Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/339,264

(22) Filed: Jun. 22, 2023

(65) Prior Publication Data
US 2023/0335433 A1    Oct. 19, 2023

Related U.S. Application Data

(63) Continuation of application No. 17/126,246, filed on Dec. 18, 2020, now Pat. No. 11,728,209.
(Continued)

(51) Int. Cl.
*H01L 21/768* (2006.01)
*H01L 21/033* (2006.01)

(52) U.S. Cl.
CPC .... *H01L 21/76816* (2013.01); *H01L 21/0335* (2013.01); *H01L 21/0337* (2013.01); *H01L 21/0338* (2013.01); *H01L 21/76877* (2013.01)

(58) Field of Classification Search
CPC ............ H01L 21/0332; H01L 21/0334; H01L 21/0335; H01L 21/0337; H01L 21/0338
See application file for complete search history.

(56) References Cited

U.S. PATENT DOCUMENTS

| | | | |
|---|---|---|---|
| 2010/0178771 A1 | 7/2010 | Oh et al. | |
| 2012/0074583 A1* | 3/2012 | Dao | H01L 23/481 257/E21.597 |

(Continued)

OTHER PUBLICATIONS

Integrated Micro Controllers. "Controlling Reflectivity and Thin Film Interference in Monochromatic Lithography." Published in 2013.
(Continued)

*Primary Examiner* — Walter H Swanson
(74) *Attorney, Agent, or Firm* — Eschweiler & Potashnik, LLC

(57) ABSTRACT

In some embodiments, the present disclosure relates to a method that includes depositing multiple hard mask layers over an interconnect dielectric layer. A first patterning layer is deposited over the multiple hard mask layers, and a first masking structure is formed over the first masking structure. The first masking structure has openings formed by a first extreme ultraviolet (EUV) lithography process. Portions of the first patterning layer are removed according to the first masking structure. A second masking structure is formed within the patterned first patterning layer. A third masking structure is formed over a topmost one of the hard mask layers and has openings formed by a second EUV lithography process. Removal processes are performed to pattern the multiple hard mask layers to form openings in the interconnect dielectric layer, and interconnect wires having rounded corners are formed within the openings of the interconnect dielectric layer.

20 Claims, 19 Drawing Sheets

Related U.S. Application Data

(60) Provisional application No. 63/081,421, filed on Sep. 22, 2020.

(56) References Cited

U.S. PATENT DOCUMENTS

| | | |
|---|---|---|
| 2015/0287675 A1 | 10/2015 | Shaviv |
| 2016/0099174 A1 | 4/2016 | Wu et al. |
| 2017/0269481 A1 | 9/2017 | Borodovsky |

OTHER PUBLICATIONS

Non-Final Office Action dated Nov. 21, 2022 for U.S. Appl. No. 17/126,246.

Notice of Allowance dated Mar. 29, 2023 for U.S. Appl. No. 17/126,246.

\* cited by examiner

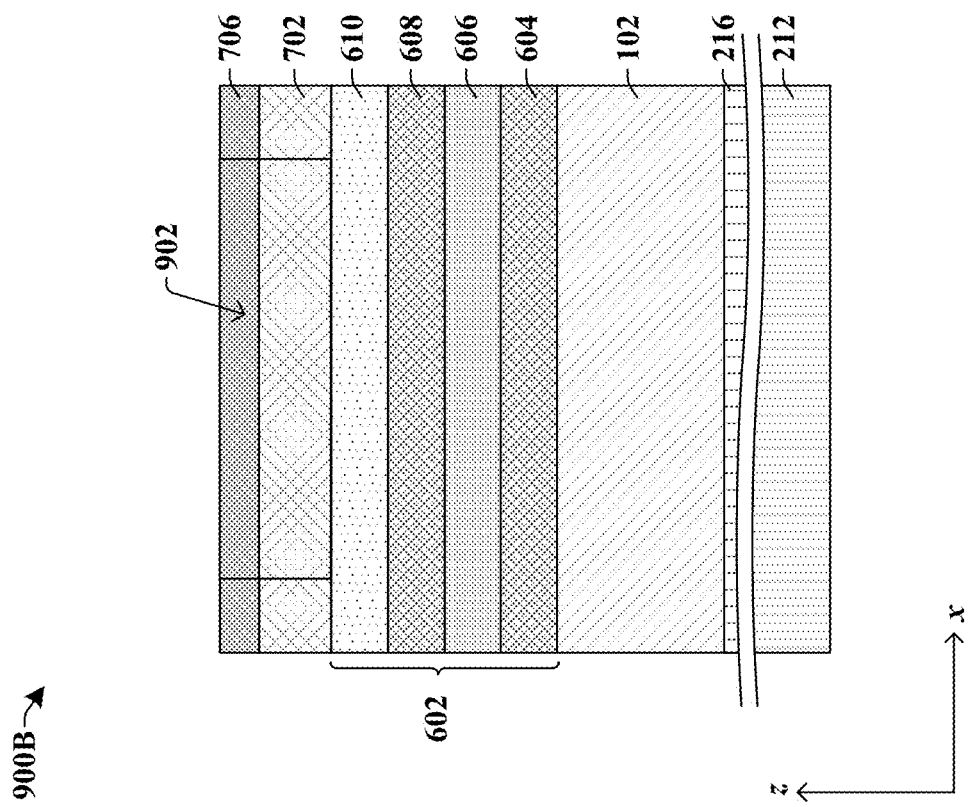
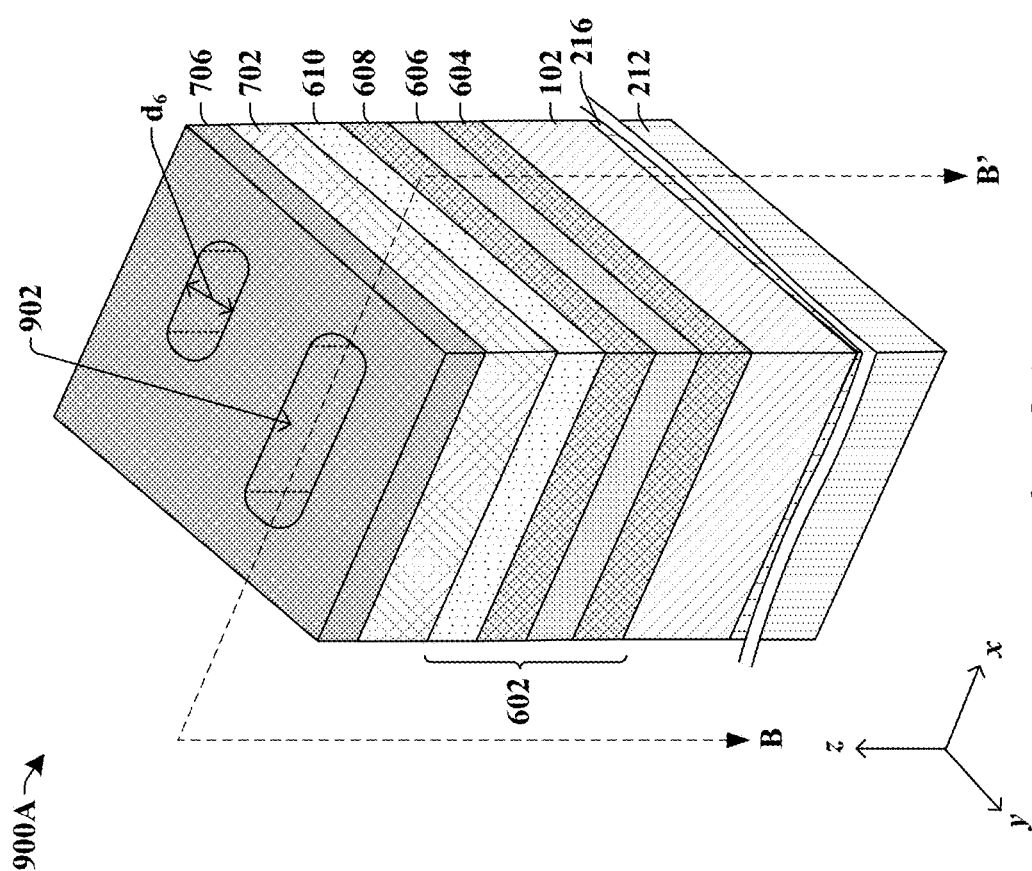
Fig. 9B
Fig. 9A

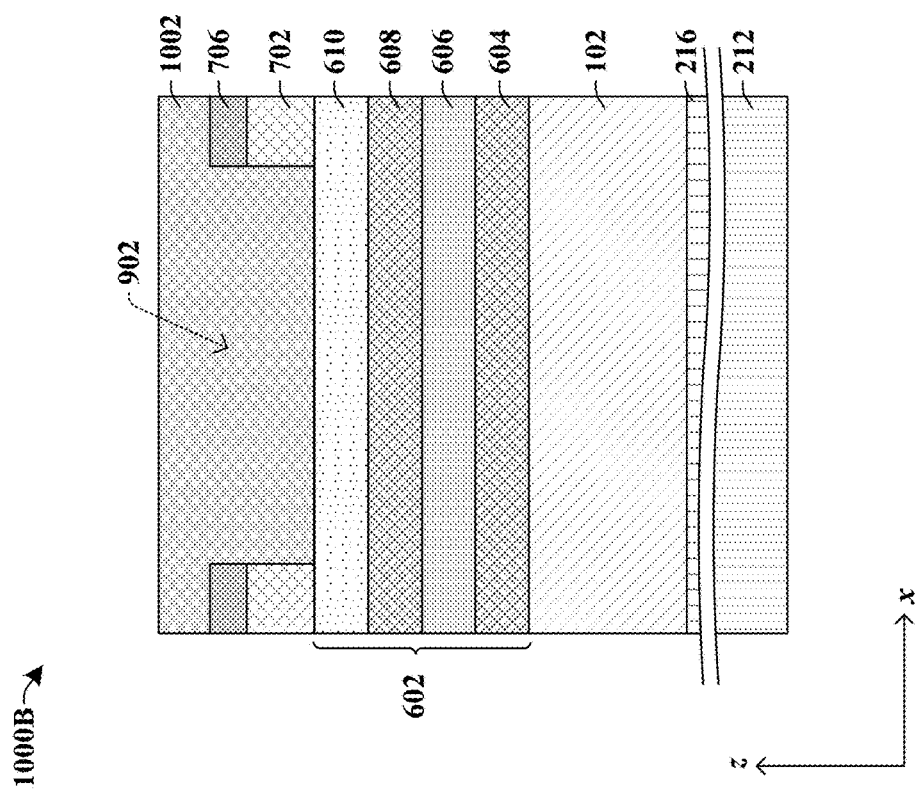
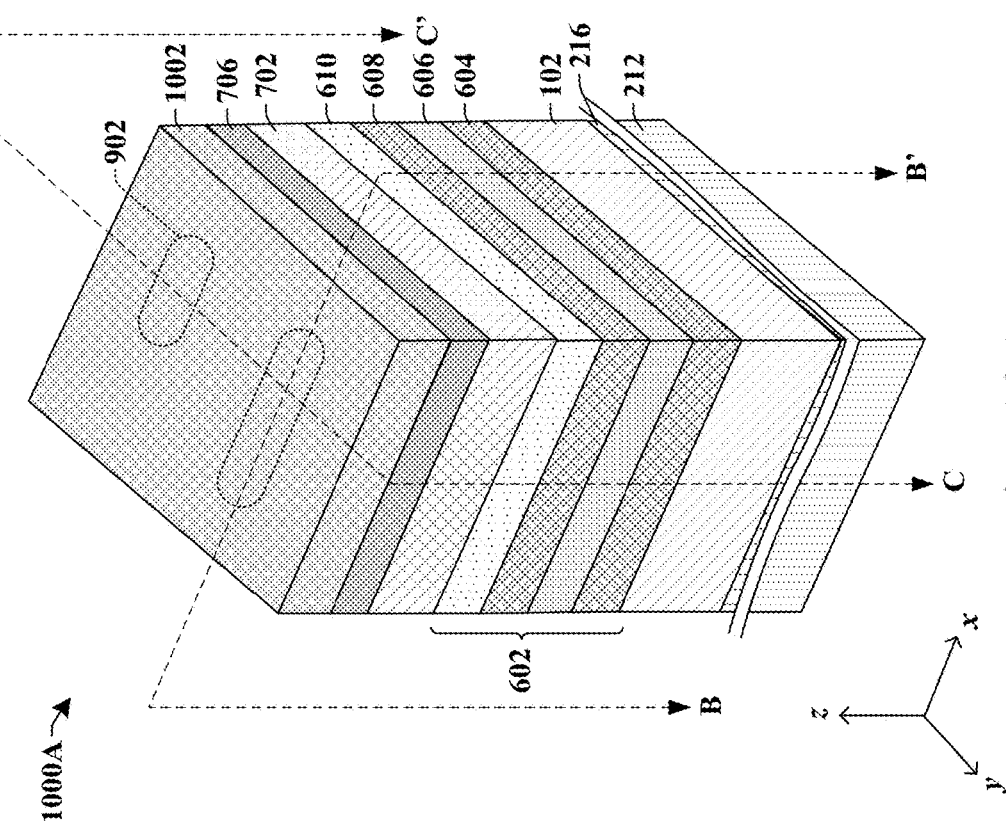
Fig. 10B
Fig. 10A

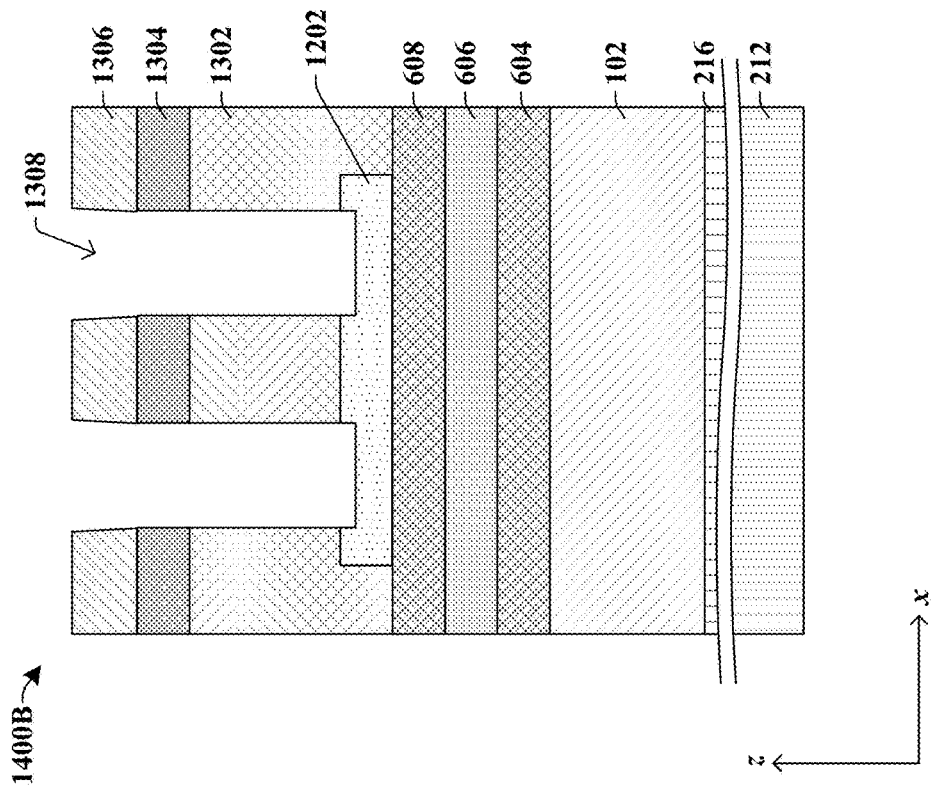
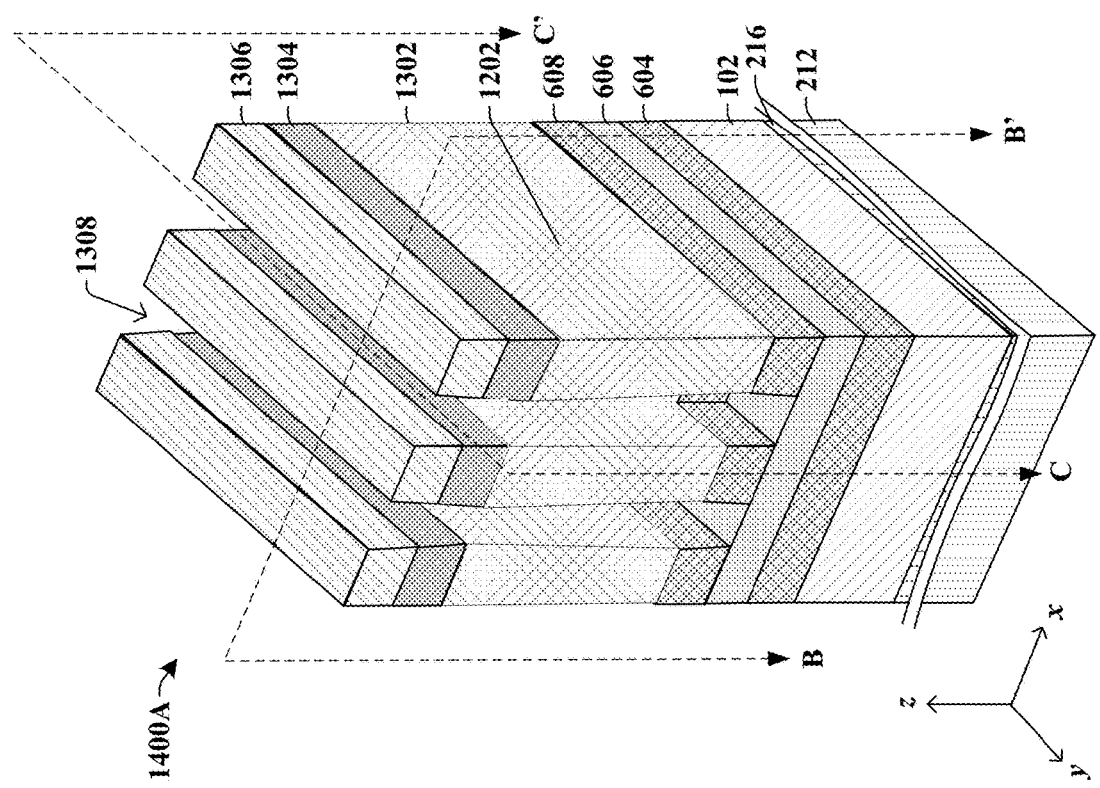
Fig. 14B
Fig. 14A

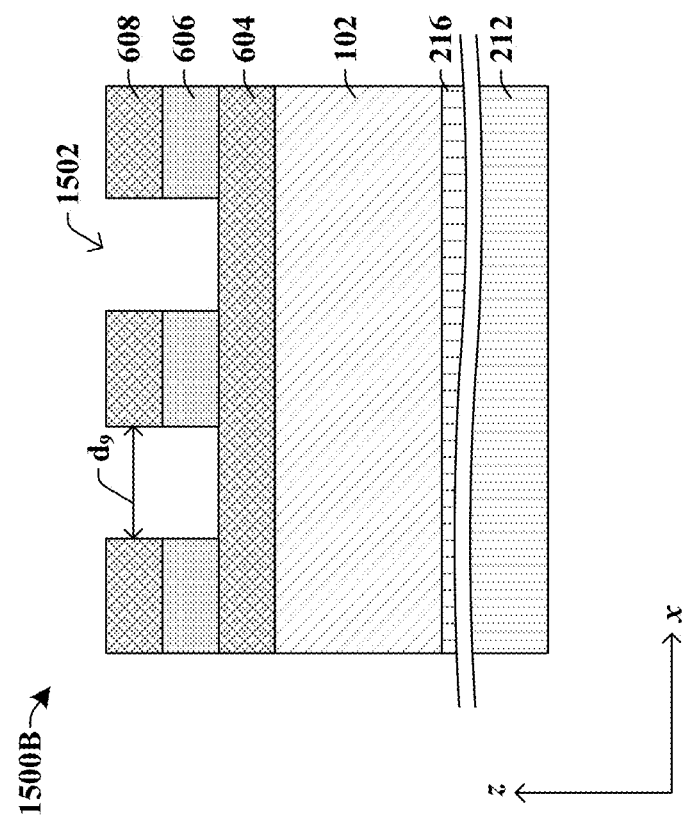
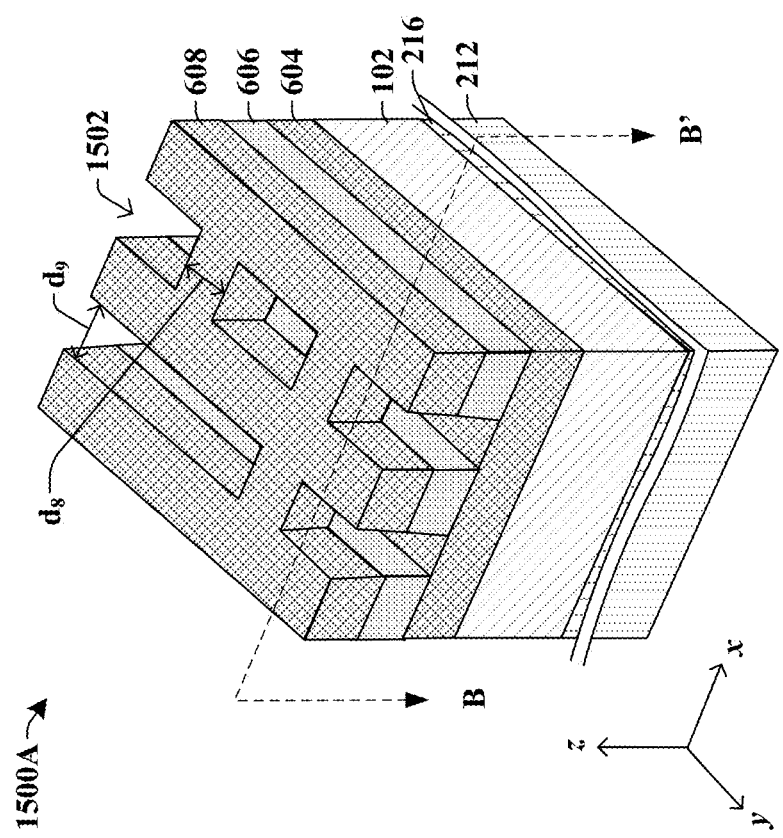
Fig. 15B
Fig. 15A

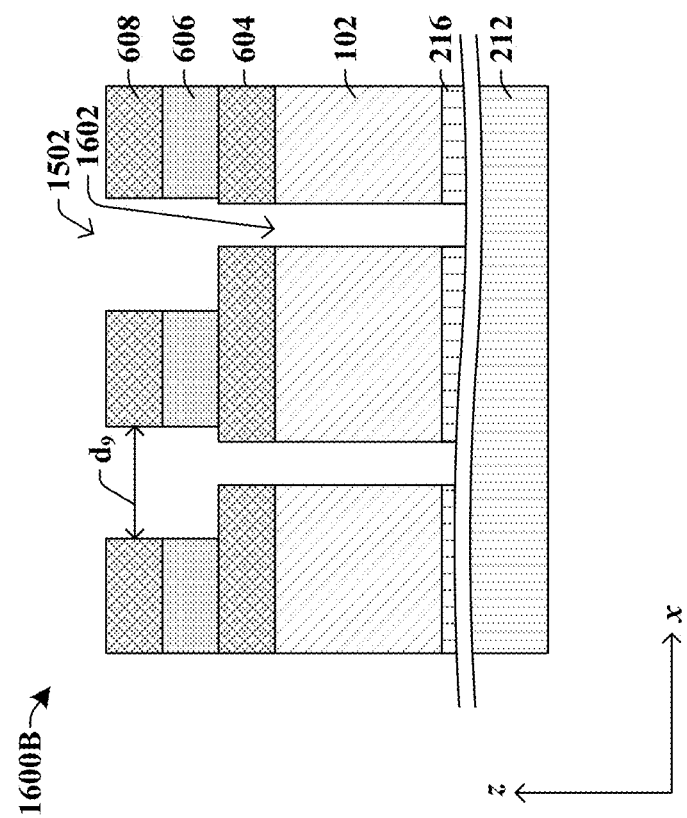
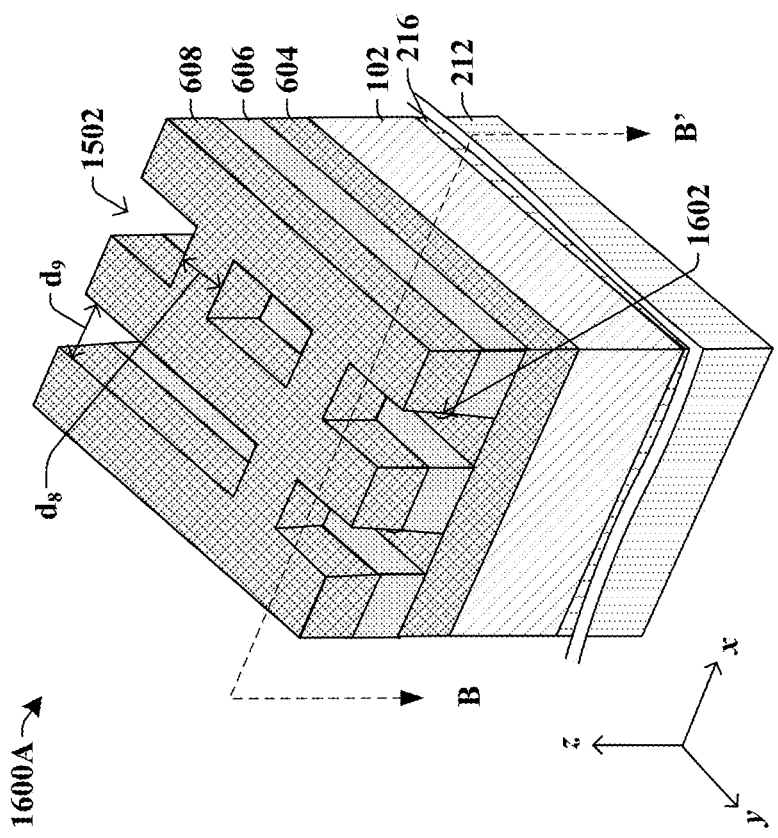
Fig. 16B
Fig. 16A

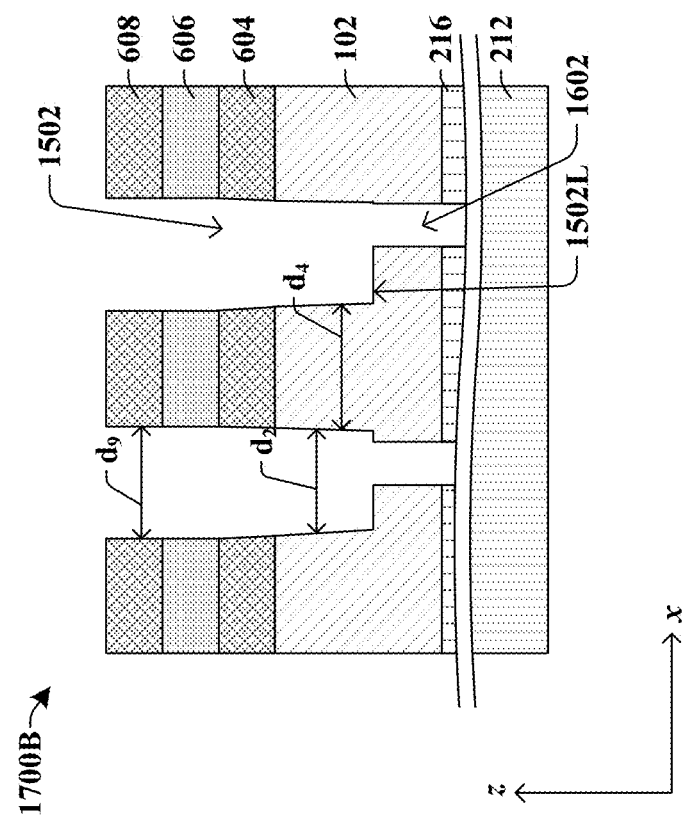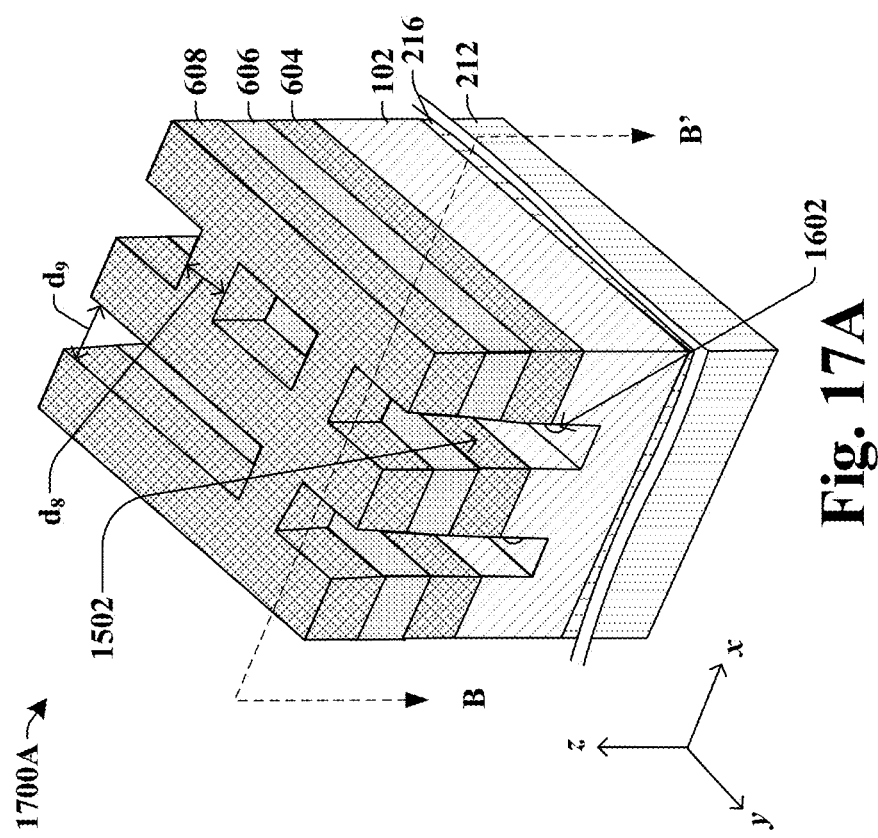

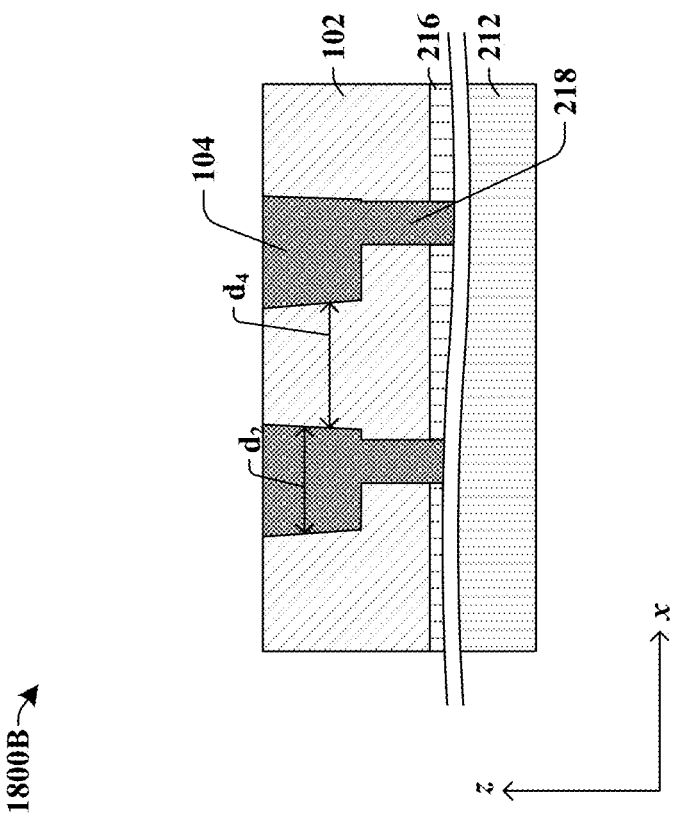
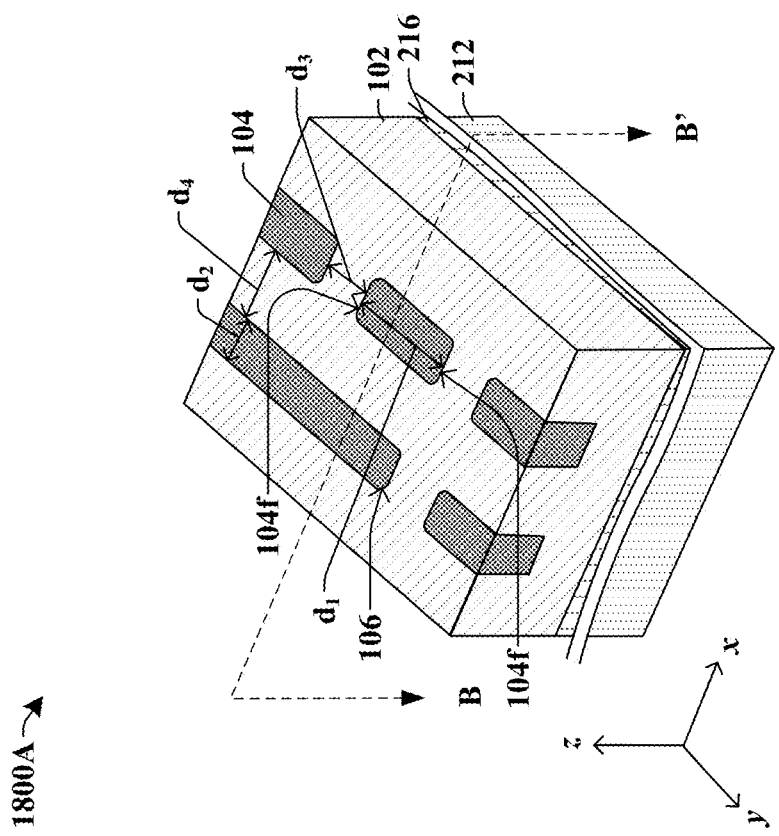
Fig. 18A
Fig. 18B

LITHOGRAPHY METHOD TO REDUCE SPACING BETWEEN INTERCONNECT WIRES IN INTERCONNECT STRUCTURE

REFERENCE TO RELATED APPLICATIONS

This application is a Continuation of U.S. application Ser. No. 17/126,246, filed on Dec. 18, 2020, which claims the benefit of U.S. Provisional Application No. 63/081,421, filed on Sep. 22, 2020. The contents of the above-referenced patent applications are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-18B illustrate various views of some embodiments of a method of forming an interconnect structure of an integrated chip by using multiple hard mask layers to form interconnect wires over a substrate that are arranged closely together to increase device density of the overall integrated chip.

DETAILED DESCRIPTION

Figure 1:
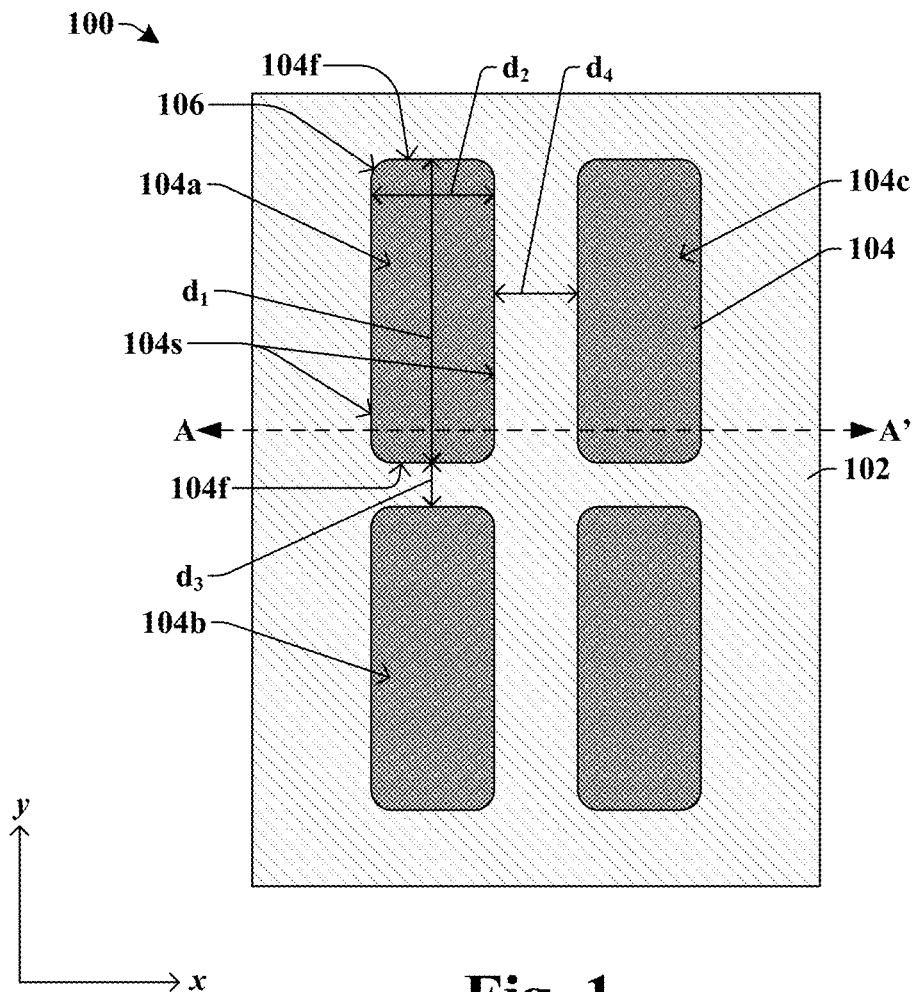
FIG. 1 illustrates a top-view of some embodiments of an integrated chip having an interconnect structure comprising interconnect wires that are closely arranged to one another and having a substantially planar of flat outer surfaces.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, inductors, capacitors, etc.) and/or memory devices disposed over and/or within a semiconductor substrate. An interconnect structure may be disposed over the semiconductor substrate and coupled to the semiconductor devices. The interconnect structure may include conductive interconnect layers having interconnect wires and interconnect vias within an interconnect dielectric structure. The interconnect wires and/or interconnect vias provide electrical pathways between different semiconductor devices disposed within and/or over the semiconductor substrate.

An interconnect structure is often formed by way of various steps of deposition processes, removal processes, and/or patterning processes. For example, an interconnect layer may be deposited over a substrate; a masking structure may be formed over the interconnect layer by way of a photolithography process; and a removal process may be performed to remove portions of the interconnect layer according to openings in the masking structure. Then, the masking structure may be removed and a conductive material may be formed within openings in the interconnect layer thereby forming interconnect vias and interconnect wires in the interconnect layer. This process may be repeated multiple times to form a network of interconnect vias and interconnect wires in many interconnect layers, thereby forming an interconnect structure over the substrate.

However, in some instances, the distance between the interconnect wires is limited by the photolithography process used to form the masking structure. Reducing the distance between the interconnect wires would allow for more interconnect wires and interconnect vias to be arranged over an area of the substrate, thereby increasing overall device density.

Various embodiments of the present disclosure relate to a method of using multiple masking structures extending in first and second directions to pattern an interconnect dielectric layer to reduce the spacing between interconnect wires formed within the patterned interconnect dielectric layer. In such embodiments, four hard mask layers are formed over the interconnect dielectric layer, and a first patterning layer is formed over the four hard mask layers. In some embodiments, a first masking structure is formed over the first patterning layer, wherein the first masking structure comprises first openings extending in a first direction. In some embodiments, a first removal process is performed to remove portions of the first patterning layer according to the first openings of the first masking structure. Then, a masking material is formed within openings of the first patterning layer to form a second masking structure, and the topmost hard mask layer is patterned according to the second masking structure.

In some embodiments, the second masking structure has dimensions smaller than the first openings of the first masking structure. In some embodiments, a third masking structure is formed over the patterned topmost hard mask layer. In some such embodiments, the third masking structure comprises second openings extending in a second direction that is substantially perpendicular to the first direction. In some embodiments, removal processes are performed to remove portions of the upper middle hard mask layer, the lower middle hard mask layer, the bottommost hard mask layer, and the interconnect dielectric layer according to the third masking structure and the patterned topmost hard mask layer. In some embodiments, the openings of the interconnect dielectric layer are filled with a conductive material to form interconnect wires within the interconnect dielectric layer. Because of the second masking structure and multiple removal processes, the interconnect wires arranged within the interconnect dielectric layer are spaced closer to together in the second direction to increase device density over the substrate.

FIG. 1 illustrates a top-view 100 of some embodiments of an interconnect structure comprising interconnect wires arranged closely to one another in an interconnect dielectric layer.

The top-view 100 of FIG. 1 includes interconnect wires 104 embedded in an interconnect dielectric layer 102. In some embodiments, the top-view 100 of FIG. 1 is on an xy-plane. In some embodiments, a first interconnect wire 104a is elongated in a y-direction. In other words, in some embodiments, the first interconnect wire 104a has first outermost sidewalls 104f that are normal to the y-direction. In some embodiments, the first outermost sidewalls 104f are parallel to one another. The first outermost sidewalls 104f are spaced apart from one another in the y-direction by a first distance $d_1$. In some embodiments, the first interconnect wire 104a has second outermost sidewalls 104s that are normal to an x-direction. In some embodiments, the x-direction is perpendicular to the y-direction. The second outermost sidewalls 104s are spaced apart from one another in the x-direction by a second distance $d_2$. In some embodiments, the second outermost sidewalls 104s are parallel to one another. Because the first distance $d_1$ is greater than the second distance $d_2$, the first interconnect wire 104a is elongated in the y-direction. In some other embodiments, the first distance $d_1$ is less than the second distance $d_2$ and thus, the first interconnect wire 104a is elongated in the x-direction.

In some embodiments, a second interconnect wire 104b is arranged below the first interconnect wire 104a in the y-direction. In some embodiments, the second interconnect wire 104b may have same or different dimensions than the first interconnect wire 104a. In some embodiments, the second interconnect wire 104b is elongated in the y-direction. In some embodiments, the first interconnect wire 104a is spaced apart from the second interconnect wire 104b in the y-direction by a third distance $d_3$.

In some embodiments, a third interconnect wire 104c is arranged beside the first interconnect wire 104a in the x-direction. In some embodiments, the third interconnect wire 104c may have same or different dimensions than the first interconnect wire 104a. In some embodiments, the third interconnect wire 104c is elongated in the y-direction. In some embodiments, the first interconnect wire 104a is spaced apart from the third interconnect wire 104c in the x-direction by a fourth distance $d_4$. In some embodiments, the fourth distance $d_4$ may be greater than the third distance $d_3$, whereas in some other embodiments, the fourth distance $d_4$ may be less than or equal to the third distance $d_3$. Further, in some embodiments, the third distance $d_3$ may be less than or equal to the second distance $d_2$.

In some embodiments, the first distance $d_1$ may be in a range of between, for example, approximately 8 nanometers and approximately 109 nanometers. In some embodiments, the second distance $d_2$ is in a range of between, for example, approximately 10 nanometers and approximately 25 nanometers. In some embodiments, the fourth distance $d_4$ is in a range of between, for example, approximately 10 nanometers and approximately 25 nanometers. In some embodiments, a pitch of the interconnect wires 104 indicates spacing of the interconnect wires 104 in the x-direction. In some embodiments, the pitch of the interconnect wires 104 is equal to a sum of the second and fourth distances $d_2$, $d_4$. In some embodiments, the pitch is in a range of between, for example, approximately 20 nanometers and approximately 50 nanometers.

In some embodiments, the interconnect wires 104 may be formed in the interconnect dielectric layer 102 by performing patterning processes to form openings in the interconnect dielectric layer 102, and then filling the openings of the interconnect dielectric layer 102 with a conductive material. In some embodiments, the patterning process used to form openings in the interconnect dielectric layer 102 utilizes multiple masking structures comprising openings elongated in the y-direction and in the x-direction and utilizes multiple etching processes which allows for the interconnect wires 104 to be spaced closer to one another. Thus, in some embodiments, the third distance $d_3$ is in a range of between approximately 8 nanometers and approximately 20 nanometers. For example, in some embodiments, the third distance $d_3$ is less than or equal to 12 nanometers. In some embodiments, the third distance $d_3$ is reduced by about 10 to 15 percent compared to other embodiments that utilize less masking structures and etching processes to form the interconnect wires 104.

Further, in some embodiments, because multiple masking structures are used in the formation of the interconnect wires 104, the first outermost sidewalls 104f are coupled to the second outermost sidewalls 104s by substantially rounded corner sidewalls 106. The first outermost sidewalls 104f and the second outermost sidewalls 104s are substantially flat (i.e., not rounded) which increases the device density of the interconnect structure over a substrate, in some embodiments.

Figure 2:
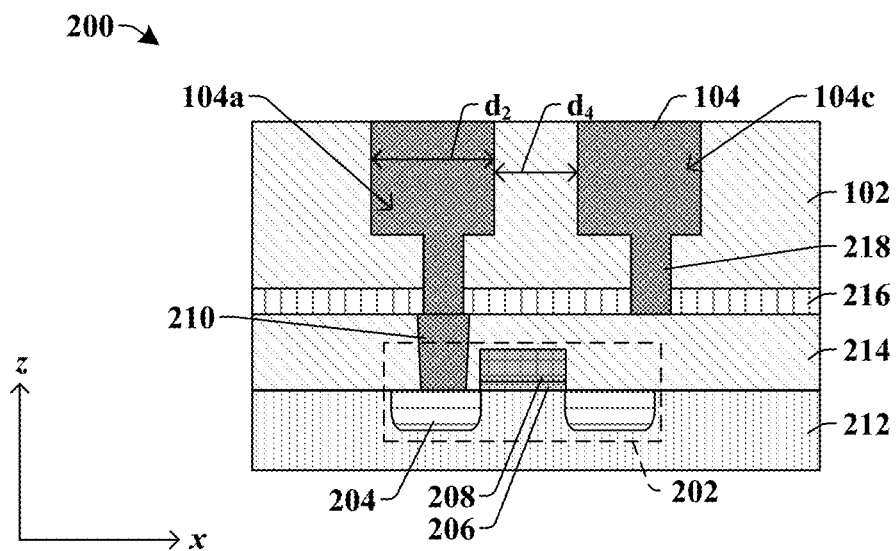
FIG. 2 illustrates a cross-sectional view of some embodiments of an integrated chip having an interconnect structure coupled to a semiconductor device, wherein interconnect wires of the interconnect structure are arranged closely to one another.

FIG. 2 illustrates a cross-sectional view 200 of some embodiments of an interconnect structure arranged over a substrate, coupled to a semiconductor device, and comprising interconnect wires arranged closely to one another.

In some embodiments, the cross-sectional view 200 of FIG. 2 corresponds to cross-section line AA' of FIG. 1. In some embodiments, the cross-sectional view 200 of FIG. 2 is on an xz-plane. In some embodiments, the interconnect wires 104 are coupled to interconnect vias 218. In some embodiments, the interconnect vias 218 extend through the interconnect dielectric layer 102. In some embodiments, the interconnect dielectric layer 102 is arranged over an etch stop layer 216, and the interconnect vias 218 extend through the etch stop layer 216 to contact a contact via 210.

In some embodiments, the interconnect wires 104 are arranged over a substrate 212 and coupled to a semiconductor device 202 through the contact via 210 and the interconnect vias 218. In some embodiments, the semiconductor device 202 may comprise, for example, a field effect transistor (FET). In such embodiments, the semiconductor device 202 may comprise source/drain regions 204 arranged on or within the substrate 212. Further, in some embodiments, the semiconductor device 202 may comprise a gate electrode 208 arranged over the substrate 212 and between the source/drain regions 204. In some embodiments, a gate dielectric layer 206 may be arranged directly between the gate electrode 208 and the substrate 212. It will be appreciated that the interconnect wires 104 may couple the semiconductor device 202 to some other semiconductor device, memory device, photo device, or some other electronic device. It will also be appreciated that other electronic/semiconductor devices other than the FET illustrated as the semiconductor device 202 are also within the scope of this disclosure.

In some embodiments, a lower interconnect dielectric layer 214 is arranged over the substrate 212; the etch stop layer 216 is arranged over the lower interconnect dielectric layer 214; and the interconnect dielectric layer 102 is arranged over the etch stop layer 216. In some embodiments, the contact via 210 extends through the lower interconnect dielectric layer 214 to contact a feature (e.g., a source/drain region 204 or the gate electrode 208) of the semiconductor device 202.

In some embodiments, the first interconnect wire 104a is spaced apart from the third interconnect wire 104c in the x-direction by the fourth distance $d_4$. In some embodiments, the second distance $d_2$ is greater than the fourth distance $d_4$, whereas in some other embodiments, the second distance $d_2$ is less than or equal to the fourth distance $d_4$. Because of the multiple masking structures and etching processes used to form the interconnect wires 104 in the interconnect dielectric layer 102, the interconnect wires 104 may have smaller second and fourth distances $d_2$, $d_4$ which allows more interconnect wires 104 and semiconductor devices 202 to be arranged on an area of the substrate 212 to increase device density of the overall integrated chip.

Figure 3:
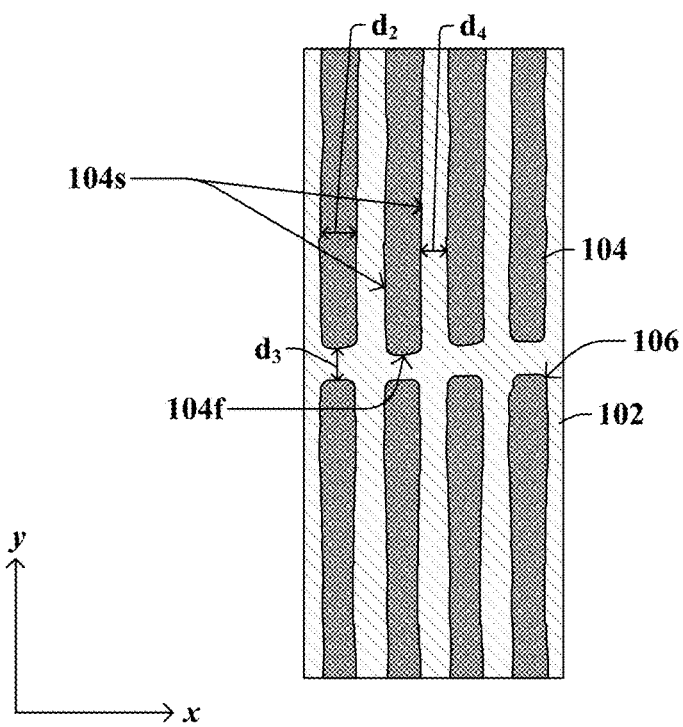
FIG. 3 illustrates a top-view of some other embodiments of an integrated chip having an interconnect structure comprising interconnect wires that are closely arranged to one another and having a substantially planar of flat outer surfaces.

FIG. 3 illustrates a top-view 300 of some other embodiments of an interconnect structure comprising interconnect wires arranged closely to one another in an interconnect dielectric layer.

As illustrated in the top-view 300, in some embodiments, the first outermost sidewalls 104f and the second outermost sidewalls 104s of the interconnect wires 104 may not be continuously planar. For example, in some embodiments, the first outermost sidewalls 104f and the second outermost sidewalls 104s of the interconnect wires 104 may be described as being jagged. However, in some embodiments, the interconnect wires 104 may still have an overall rectangular like shape with substantially rounded corner sidewalls 106.

Further, in some embodiments, the third distance $d_3$, which is the distance between interconnect wires 104 in the y-direction may vary when there are multiple interconnect wires 104 arranged in the interconnect dielectric layer 102. The variation in the third distance $d_3$ may be due to precision and accuracy of the patterning and removal processes used to form the interconnect wires 104. In some embodiments, a maximum value of the third distance $d_3$ may be less than or equal to about 12 nanometers. For example, in some embodiments, the third distance $d_3$ may be in a range of between, for example, approximately 1 nanometer and approximately 12 nanometers. In some other embodiments, a maximum value of the third distance $d_3$ may be in a range of between, for example, approximately 8 nanometers and approximately 20 nanometers.

Figure 4:
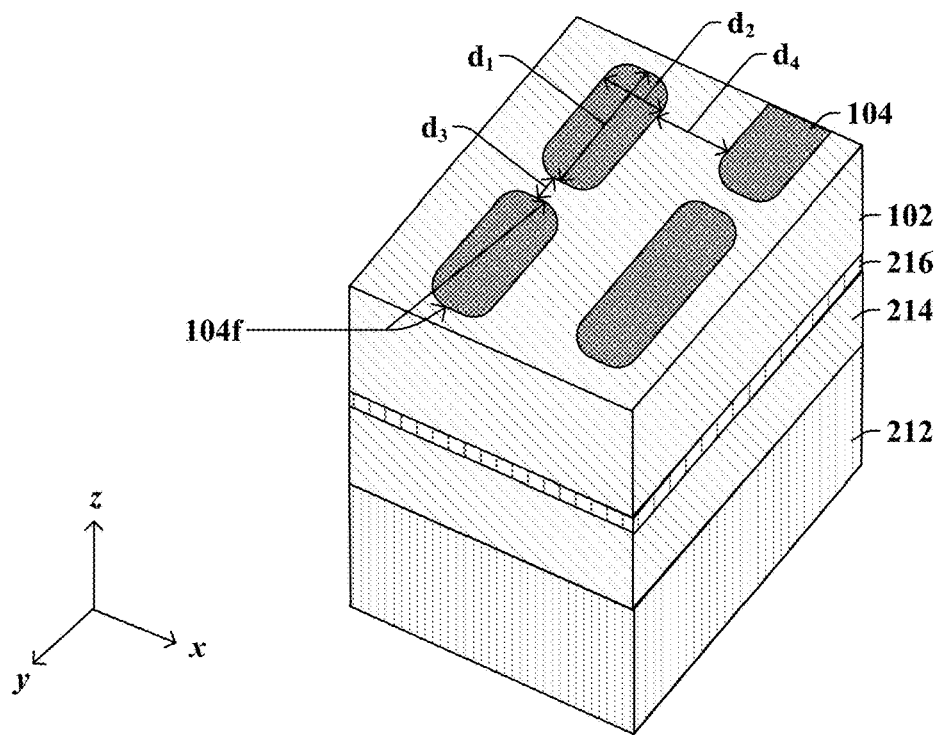
FIG. 4 illustrates a perspective view of some embodiments of an integrated chip having an interconnect structure comprising interconnect wires that are closely arranged to one another and having a substantially planar of flat outer surfaces.

FIG. 4 illustrates a perspective view 400 of yet some other embodiments of an interconnect structure arranged over a substrate and comprising interconnect wires arranged closely to one another in an interconnect dielectric layer.

As shown in FIG. 4, in some embodiments, the interconnect wires 104 may be somewhat staggered, meaning some of the interconnect wires 104 may have different first distances $d_1$ and/or have different locations of the first outermost sidewalls 104f on the y-axis. Thus, it will be appreciated that other designs (e.g., dimensions, locations, etc.) of the interconnect wires 104 than what is illustrated in FIGS. 1-4 are also within the scope of this disclosure. Openings within the multiple masking structures used to form the interconnect wires 104 may be adjusted based on the desired design of the interconnect wires 104 within the interconnect dielectric layer 102.

FIGS. 5-18B illustrate various views 500-1800B of some embodiments of a method of forming an interconnect structure of an integrated chip by using multiple hard mask layers to form interconnect wires over a substrate that are arranged closely together to increase device density of the overall integrated chip. Although FIGS. 5-18B are described in relation to a method, it will be appreciated that the structures disclosed in FIGS. 5-18B are not limited to such a method, but instead may stand alone as structures independent of the method.

Figure 5:
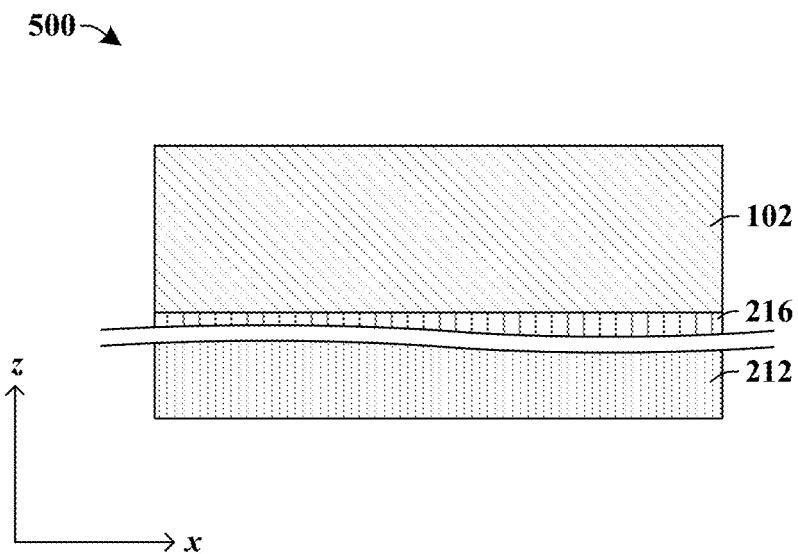

As shown in cross-sectional view 500 of FIG. 5, a substrate 212 is provided. In some embodiments, the substrate 212 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, an etch stop layer 216 is formed over the substrate 212. In some embodiments, the etch stop layer 216 is formed by way of a deposition process (e.g., physical vapor deposition (PVD), chemical vapor deposition (CVD), atomic layer deposition (ALD), spin-on, etc.). In some embodiments, the etch stop layer 216 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material. In some embodiments, various semiconductor devices (e.g., transistors, inductors, capacitors, etc.) and/or memory devices (not shown) may be arranged over and/or within the substrate 212 and beneath the etch stop layer 216.

In some embodiments, an interconnect dielectric layer 102 may be formed over the etch stop layer 216 by way of a deposition process (e.g., spin-on, PVD, CVD, ALD, etc.). In some embodiments, the interconnect dielectric layer 102 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 6:
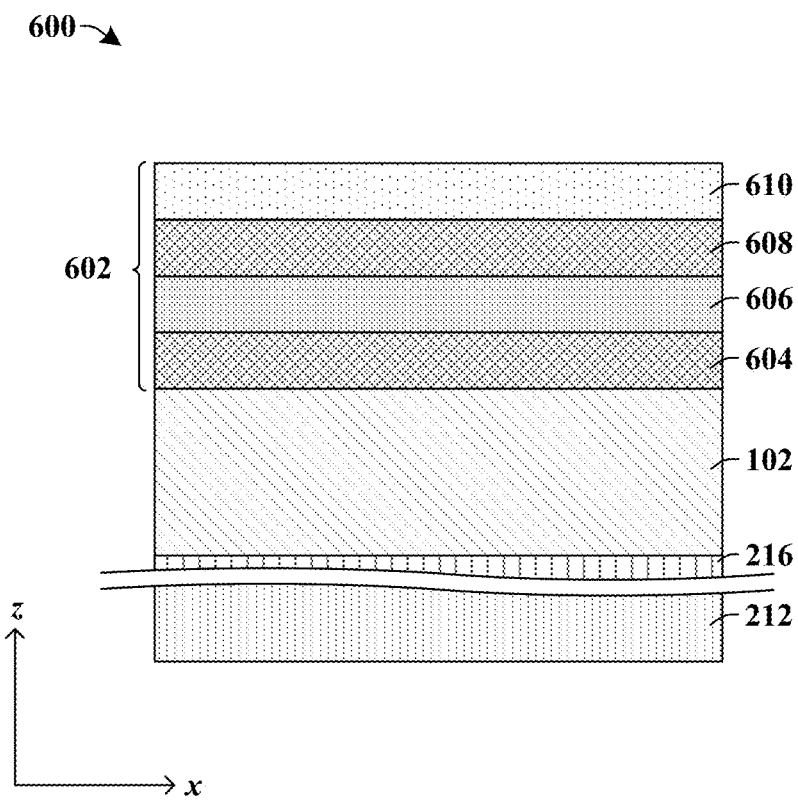

As shown in cross-sectional view 600 of FIG. 6, in some embodiments, a stack of hard mask layers 602 is formed over the interconnect dielectric layer 102. In some embodiments, the stack of hard mask layers 602 comprises a first hard mask layer 604, a second hard mask layer 606 arranged over the first hard mask layer 604, a third hard mask layer 608 arranged over the second hard mask layer 606, and a fourth hard mask layer 610 arranged over the third hard mask layer 608. In some embodiments, each of the first through fourth hard mask layers (604, 606, 608, 610) may be formed by way of a deposition process (e.g., spin-on, PVD, CVD, ALD, etc.).

In some embodiments, the first hard mask layer 604 may comprise, for example, an oxide (e.g., silicon oxide), a nitride (e.g., silicon nitride, silicon oxynitride), or the like. In some embodiments, the first hard mask layer 604 may have a thickness in a range of between, for example, approximately 100 angstroms and approximately 200 angstroms. In some embodiments, the second hard mask layer 606 may comprise, for example, titanium nitride, titanium oxide, tungsten, silicon, a metal oxide, or the like. In some embodiments, the second hard mask layer 606 has a thickness in a range of between, for example, approximately 100 angstroms and approximately 300 angstroms. In some embodiments, the third hard mask layer 608 may comprise, for example, an oxide (e.g., silicon oxide), a nitride (e.g., silicon nitride, silicon oxynitride), or the like. In some embodiments, the first hard mask layer 604 may have a thickness in a range of between, for example, approximately 100 angstroms and approximately 300 angstroms. In some embodiments, the first and third hard mask layers 604, 608 comprise a same material, whereas in some other embodiments, the first and third hard mask layers 604, 608 comprise different materials. In some embodiments, the fourth hard mask layer 610 may comprise, for example, silicon or some other suitable hard mask material. In some embodiments, the fourth hard mask layer 610 has a thickness in a range of between, for example, approximately 100 angstroms and approximately 300 angstroms.

Figure 7:
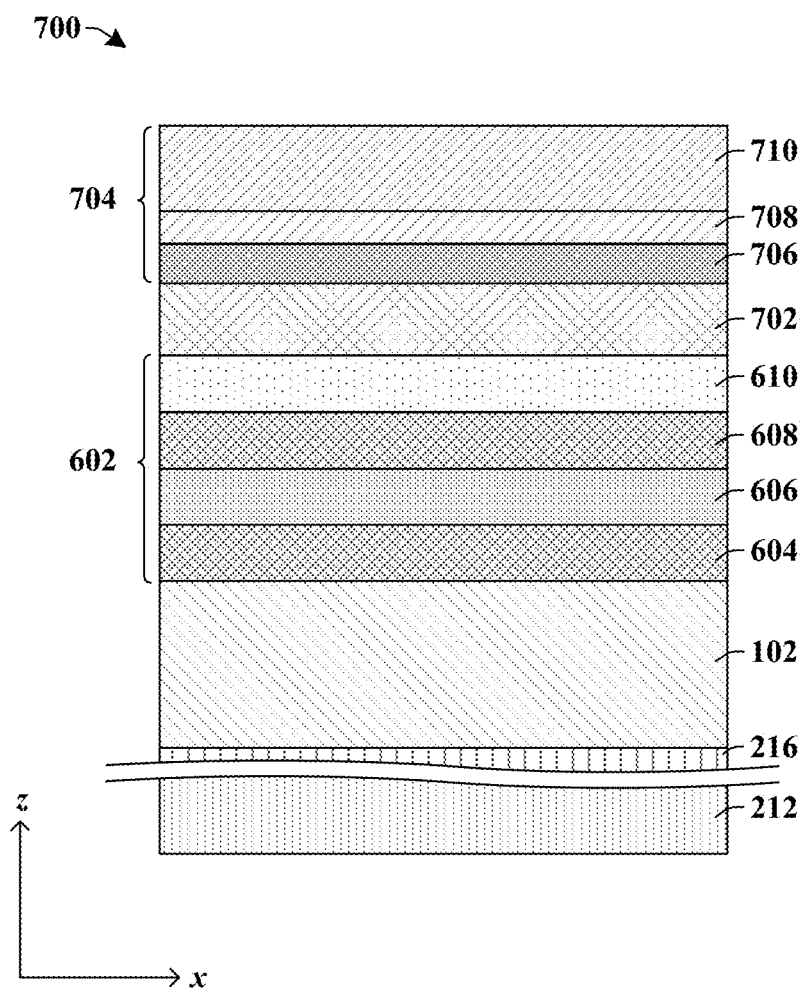

As shown in cross-sectional view 700 of FIG. 7, in some embodiments, a first patterning layer 702 is formed over the stack of hard mask layers 602. In some embodiments, the first patterning layer 702 is formed by way of a spin-on process. In some embodiments, the first patterning layer 702 comprises, for example, carbon, silicon carbide, or the like. In some embodiments, the first patterning layer 702 has a thickness in a range of between, for example, approximately 200 angstroms and approximately 500 angstroms.

Further, a stack of photolithography layers 704 are formed over the first patterning layer 702. In some embodiments, the stack of photolithography layers 704 comprises a first anti-reflective layer 706, a bottom anti-reflective coating (BARC) layer 708 arranged over the first anti-reflective layer 706, and a photoresist layer 710 arranged over the BARC layer 708. In some embodiments, each of the layers in the stack of photolithography layers 704 may be formed by way of a deposition process (e.g., PVD, CVD, ALD, spin-on, etc.).

In some embodiments, the first anti-reflective layer 706 may comprise, for example, silicon oxygen carbide, silicon, silicon oxynitride, titanium oxide, or the like. In some other embodiments, the first anti-reflective layer 706 may also be a BARC layer and comprise, for example, an organic material. In some embodiments, the first anti-reflective layer 706 has a thickness in a range of between, for example, approximately 50 angstroms and approximately 300 angstroms. In some embodiments, the BARC layer 708 comprises an organic material and has a thickness in a range of between, for example, approximately 50 angstroms and approximately 200 angstroms. In some embodiments, the photoresist layer 710 comprises a photoresist material and has a thickness in a range of between, for example, approximately 200 angstroms and approximately 500 angstroms.

Figure 8B:
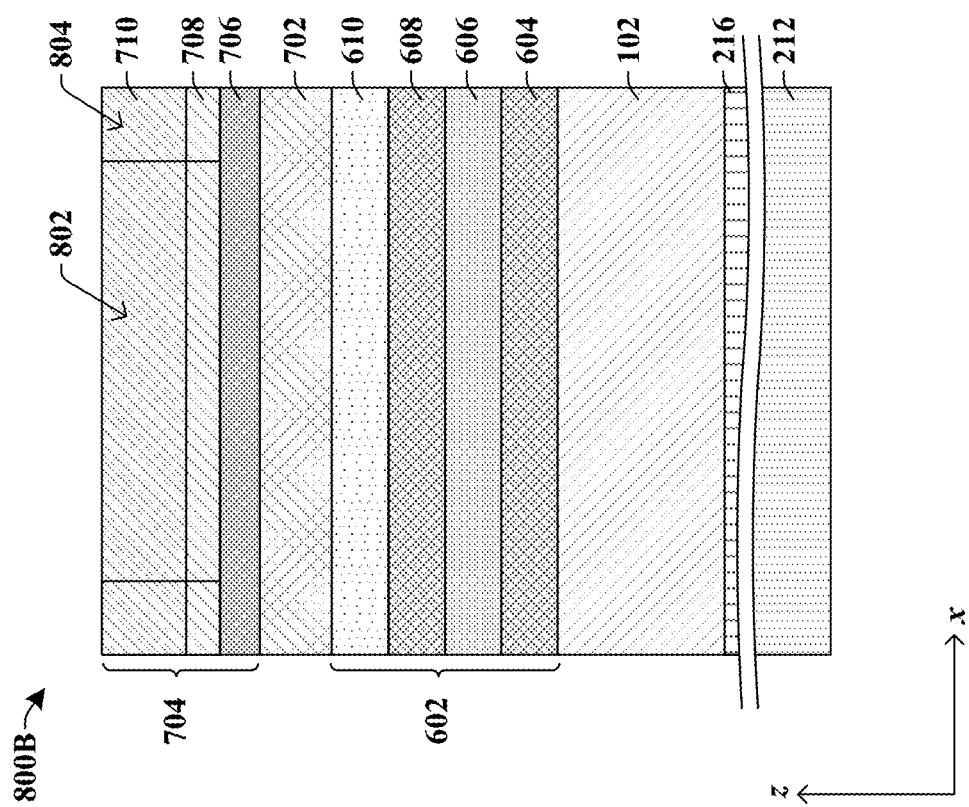
Figure 8A:
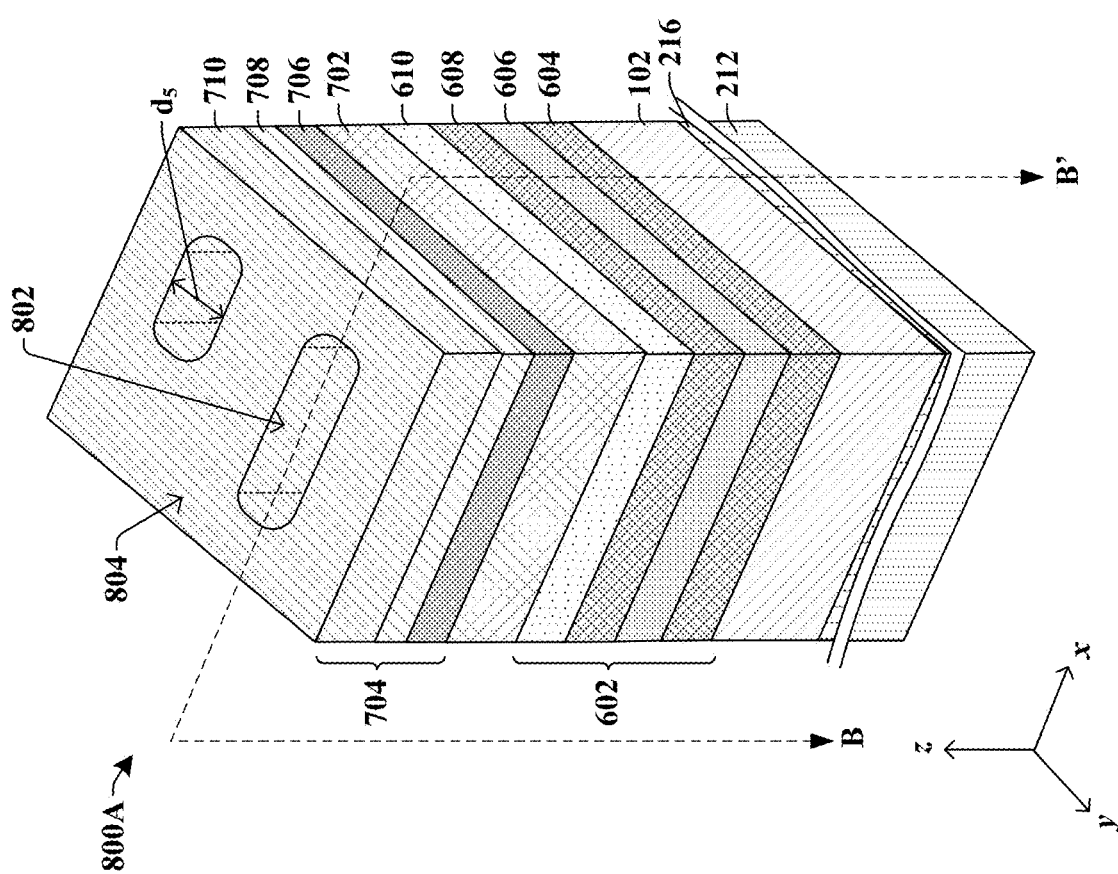

As shown in perspective view 800A of FIG. 8A, in some embodiments, a patterning process is performed to form first openings 802 in the photoresist layer 710 that are elongated in the x-direction. Further, remaining portions of the photoresist layer 710 form a first masking structure 804. In some embodiments, the patterning process comprises a lithography process, such as, for example, extreme ultraviolet (UV) lithography which utilizes UV light having a wavelength between approximately 10 nanometers and approximately 15 nanometers to achieve small first openings 802 in the photoresist layer 710. For example, in some embodiments, the first openings 802 have a width measured in the y-direction equal to a fifth distance $d_5$. In some embodiments, the fifth distance $d_5$ may be in a range of between, for example, approximately 20 nanometers and approximately 28 nanometers. In some embodiments, the length of the first openings 802 measured in the x-direction may vary or may be the same amongst each of the first openings 802.

In some embodiments, the first openings 802 are formed by exposing certain areas of the photoresist layer 710 to UV light according to a photoreticle to change the solubility of the certain areas of the photoresist layer 710. Then, a removal process (e.g., wet etching) is performed to remove the certain areas of the photoresist layer 710 which are soluble to form the first openings 802.

FIG. 8B illustrates a cross-sectional view 800B of some embodiments of the first openings 802 from the xz-plane. Thus, in some embodiments, the cross-sectional view 800B of FIG. 8B corresponds to cross-section line BB' of FIG. 8A.

As shown in the cross-sectional view 800B of FIG. 8B, in some embodiments, the first openings 802 extend through the photoresist layer 710 and the BARC layer 708. The first openings 802 are illustrated as more transparent than areas of the photoresist layer 710 and the BARC layer 708 that do not comprise the first openings 802 in the cross-sectional view 800B of FIG. 8B. In some embodiments, the BARC layer 708 and the first anti-reflective layer 706 improve the precision and accuracy of the lithography process used to form the first openings 802.

As shown in perspective view 900A of FIG. 9A, in some embodiments, a removal process may be performed to remove portions of the first anti-reflective layer 706 and the first patterning layer 702 according to the first openings (802 of FIG. 8A) of the photoresist layer (710 of FIG. 8A) thereby forming second openings 902 in the first anti-reflective layer 706 and the first patterning layer 702. In some embodiments, the removal process may comprise, for example, a dry etching process. In some embodiments, the photoresist layer (710 of FIG. 8A) and the BARC layer (708 of FIG. 8A) are removed after the removal process of FIG. 9A. In some embodiments, the second openings 902 have a width measured in the y-direction equal to a sixth distance $d_6$. In some embodiments, the sixth distance $d_6$ is less than the fifth distance ($d_5$ of FIG. 8A) of the first openings (802 of FIG. 8A) in the photoresist layer (710 of FIG. 8A) due to residual effects of the removal process by dry etching. For example, in some embodiments, during an etching process, the openings formed within a layer from openings in a masking structure are reduced in size compared to the openings in the masking structure because the etching process forms slanted sidewalls within the layer. In some embodiments, the sixth distance $d_6$ is in a range of between, for example, approximately 8 nanometers and approximately 16 nanometers. In some embodiments, the sixth distance $d_6$ is less than or equal to about 12 nanometers.

FIG. 9B illustrates a cross-sectional view 900B of some embodiments of the second openings 902 from the xz-plane. Thus, in some embodiments, the cross-sectional view 900B of FIG. 9B corresponds to cross-section line BB' of FIG. 9A.

As shown in the cross-sectional view 900B of FIG. 9B, in some embodiments, the second openings 902 extend through the first anti-reflective layer 706 and the first patterning layer 702. The second openings 902 are illustrated as more transparent than areas of the first anti-reflective layer 706 and the first patterning layer 702 that do not comprise the second openings 902 in the cross-sectional view 900B of FIG. 9B. In some embodiments, the fourth hard mask layer 610 is substantially resistant to removal by the removal process of FIGS. 9A and 9B. In other words, in some embodiments, the fourth hard mask layer 610 acts as an etch stop layer such that the second openings 902 do not extend into the fourth hard mask layer 610. Thus, in some embodiments, the fourth hard mask layer 610 comprises a different material than the first patterning layer 702.

As shown in perspective view 1000A of FIG. 10A, in some embodiments, a masking material 1002 is formed within the second openings 902 of the first anti-reflective layer 706 and the first patterning layer 702. In some embodiments, the second openings 902 of the first anti-reflective layer 706 and the first patterning layer 702 aren't visible from the perspective view 1000A because the masking material 1002 is covering the second openings 902. Thus, the second openings 902 are illustrated with dotted lines in FIG. 10A. In some embodiments, the masking material 1002 comprises a different material than the fourth hard mask layer 610 and may comprise, for example, an oxide or some suitable hard mask dielectric material. In some embodiments, the masking material 1002 is formed by way of a deposition process (e.g., PVD, CVD, ALD, spin-on, etc.).

FIG. 10B illustrates a cross-sectional view 1000B of some embodiments of the embodiment of FIG. 10A on the xz-plane and corresponding to cross-section line BB' of FIG. 10A.

As shown in cross-sectional view 1000B of FIG. 10B, the masking material 1002 is thicker than the first anti-reflective layer 706 and the first patterning layer 702 to completely fill the second openings 902 of the first anti-reflective layer 706 and the first patterning layer 702.

Figure 10C:
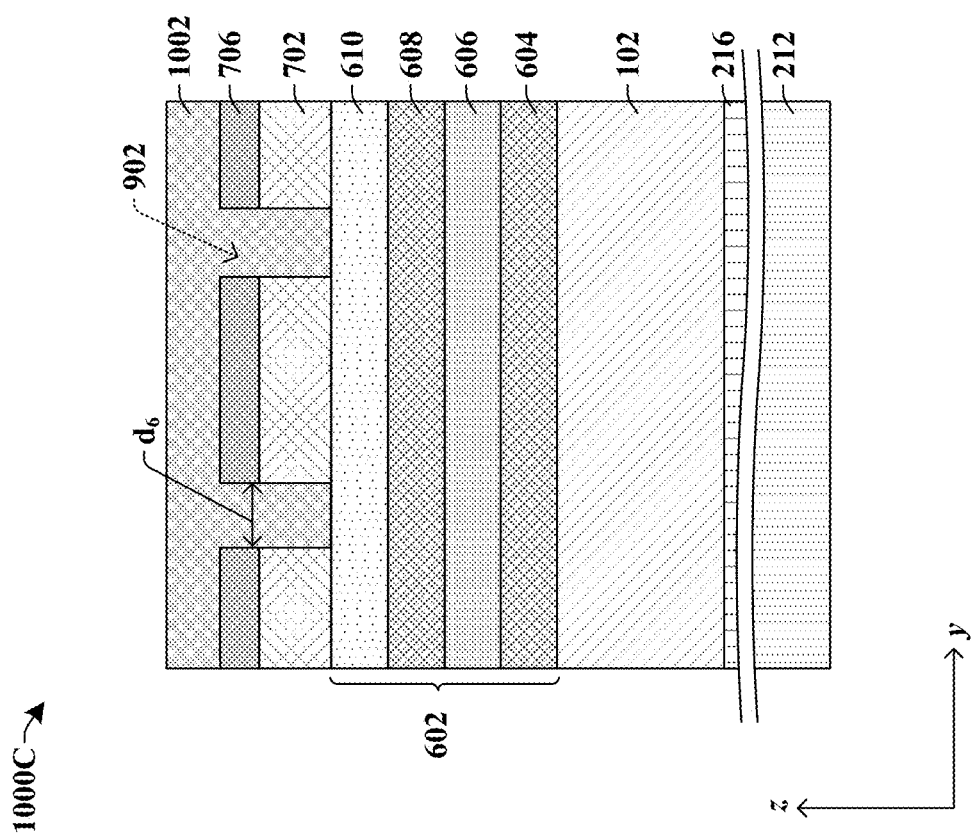

FIG. 10C illustrates a cross-sectional view 1000C of some embodiments of the embodiment of FIG. 10A on the yz-plane and corresponding to cross-section line CC' of FIG. 10A.

As shown in cross-sectional view 1000C, the masking material 1002 arranged within the first anti-reflective layer 706 and the first patterning layer 702 has a width equal to the sixth distance $d_6$.

Figure 11B:
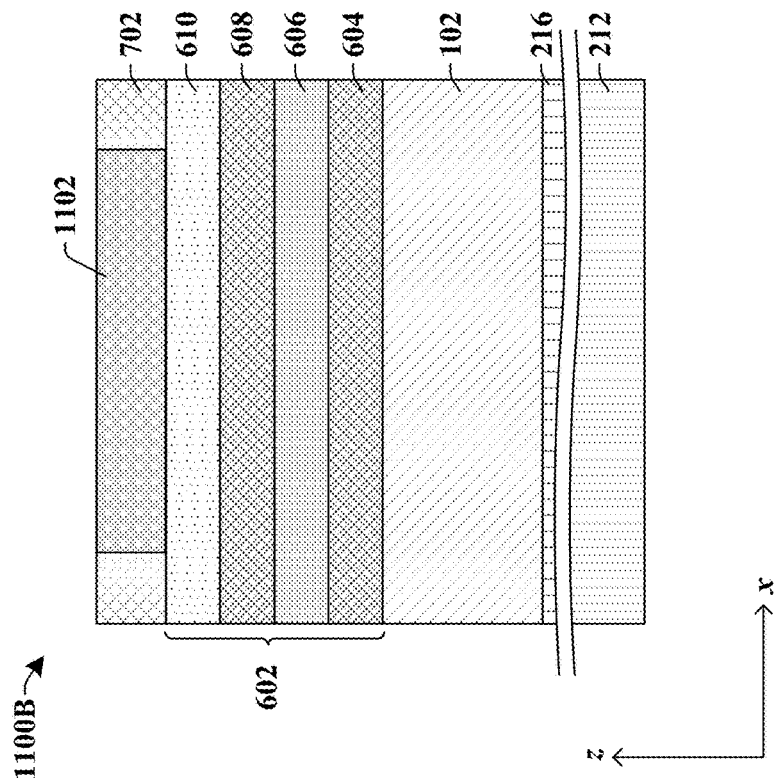
Figure 11A:
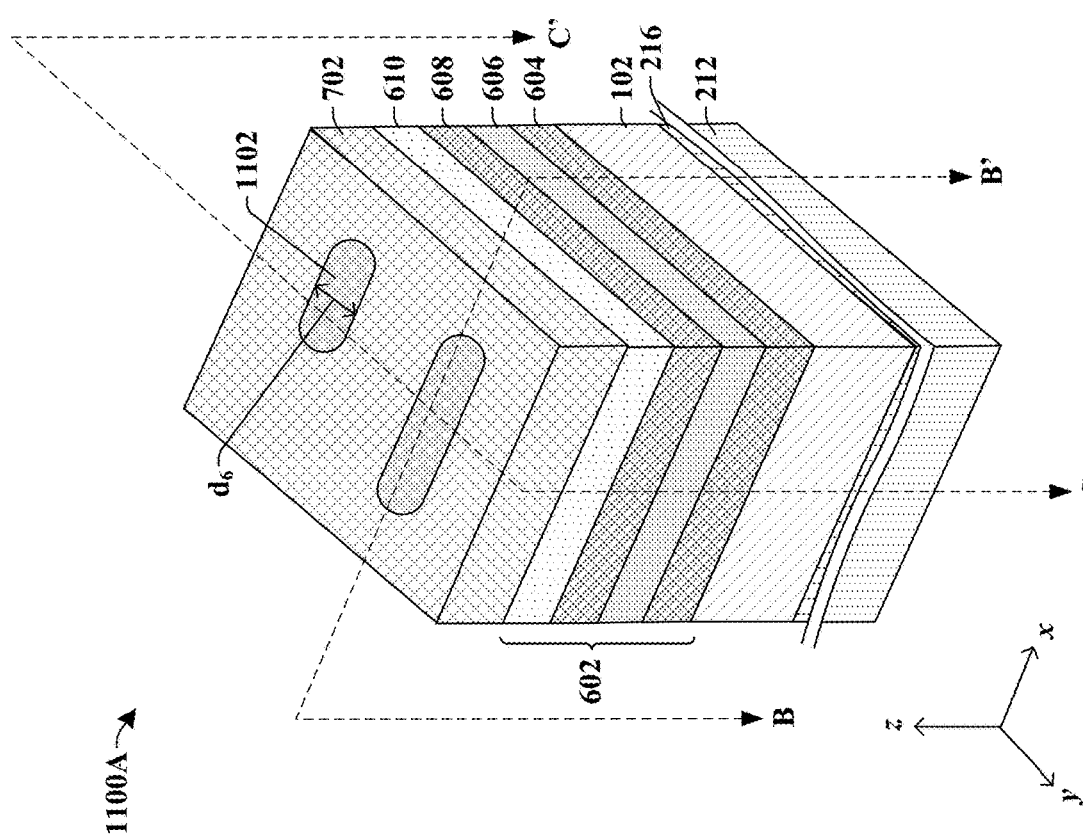
Figure 11C:
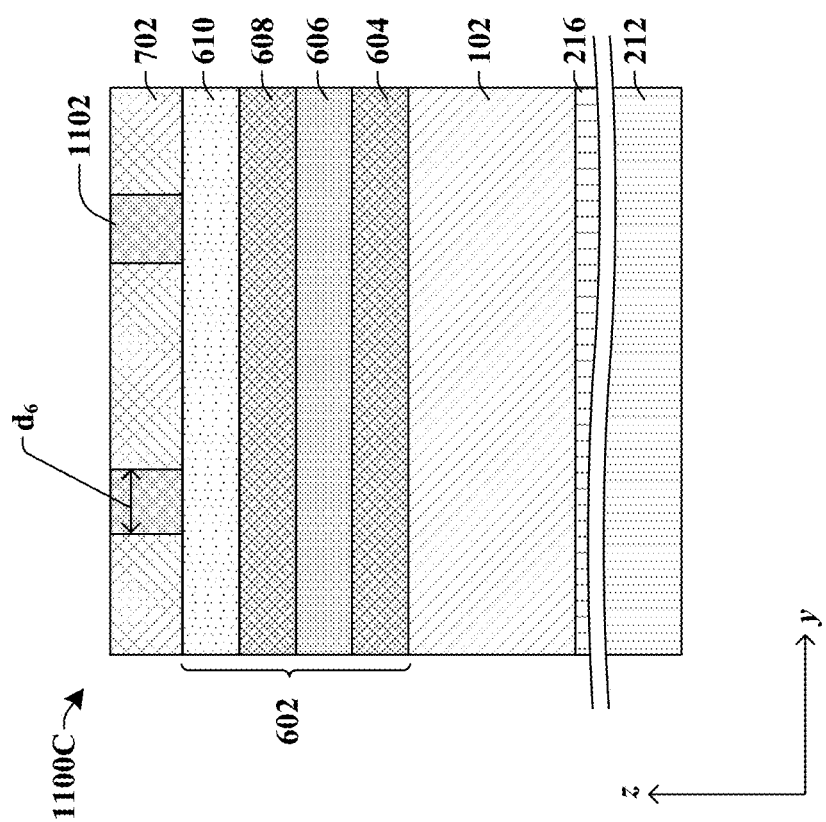

As shown in perspective view 1100A of FIG. 11A, cross-sectional view 1100B of FIG. 11B, and cross-sectional view 1100C of FIG. 11C, in some embodiments, a planarization process (e.g., chemical mechanical planarization (CMP)) is performed to remove the first anti-reflective layer (706 of FIG. 10A) and portions of the masking material (1002 of FIG. 10A) arranged over the first patterning layer 702, thereby forming a second masking structure 1102 in the second openings (902 of FIG. 10A) of the first patterning layer 702. In some embodiments, the second masking structure 1102 has a width measured in the y-direction equal to the sixth distance $d_6$. In some embodiments, after the planarization process, the second masking structure 1102 and the first patterning layer 702 have substantially coplanar topmost surfaces.

Figure 12:
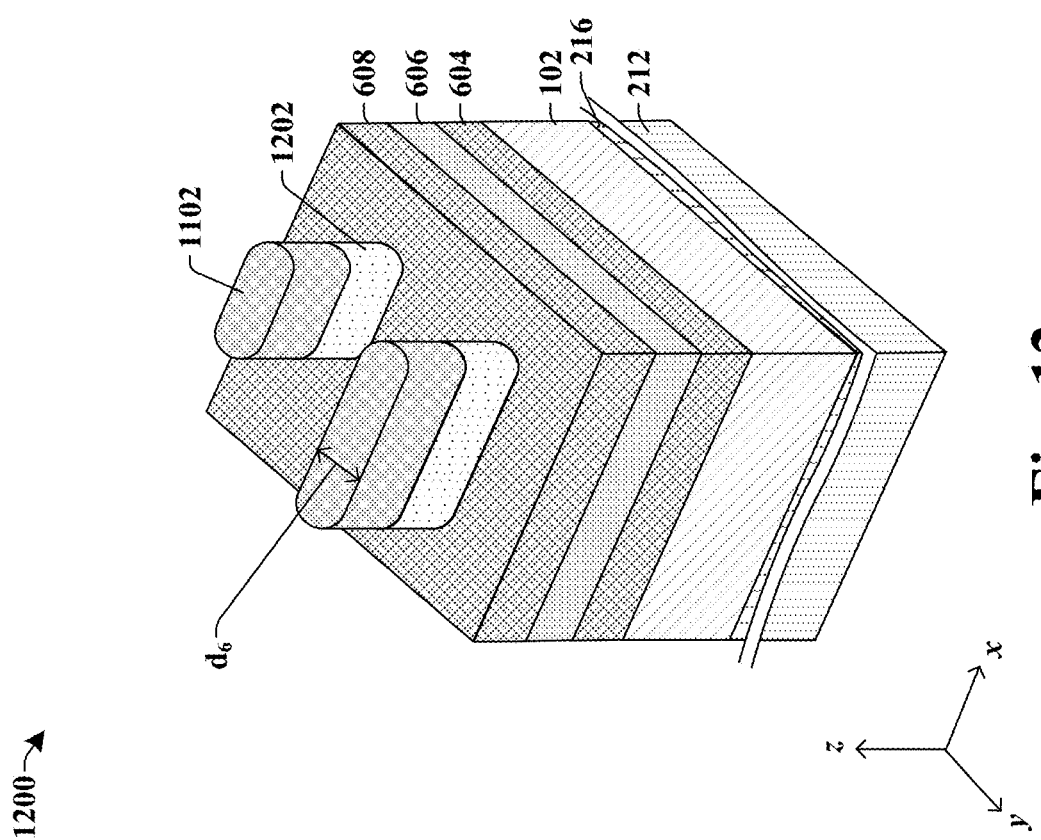

As shown in perspective view 1200 of FIG. 12, in some embodiments, a removal process is performed to remove the first patterning layer (702 of FIG. 11A) and to remove portions of the fourth hard mask layer (610 of FIG. 11A) that do not directly underlie the second masking structure 1102. Thus, in some embodiments, a patterned fourth hard mask layer 1202 is formed from the fourth hard mask layer (610 of FIG. 11A) according to the second masking structure 1102.

In some embodiments, the removal process of FIG. 12 comprises a first etching process to remove the first patterning layer (702 of FIG. 11A), wherein the second masking structure 1102 is substantially resistant to removal by the first etching process. In some embodiments, the first etching process utilizes a wet or dry etchant. In some embodiments, the removal process of FIG. 12 may comprise a second etching process following the first etching process and different than the first etching process to remove portions of the fourth hard mask layer (610 of FIG. 11A) according to the second masking structure 1102. In some embodiments, the second etching process utilizes a wet or dry etchant, such as, for example, chlorine, methane, nitrogen gas, or hydrobromic acid. In some other embodiments, a same etching process may be used to remove the first patterning layer (702 of FIG. 11A) and portions of the fourth hard mask layer (610 of FIG. 11A). In some embodiments, the third hard mask layer 608 is substantially resistant to removal from the etchant(s) used in the removal process of FIG. 12.

Figure 13B:
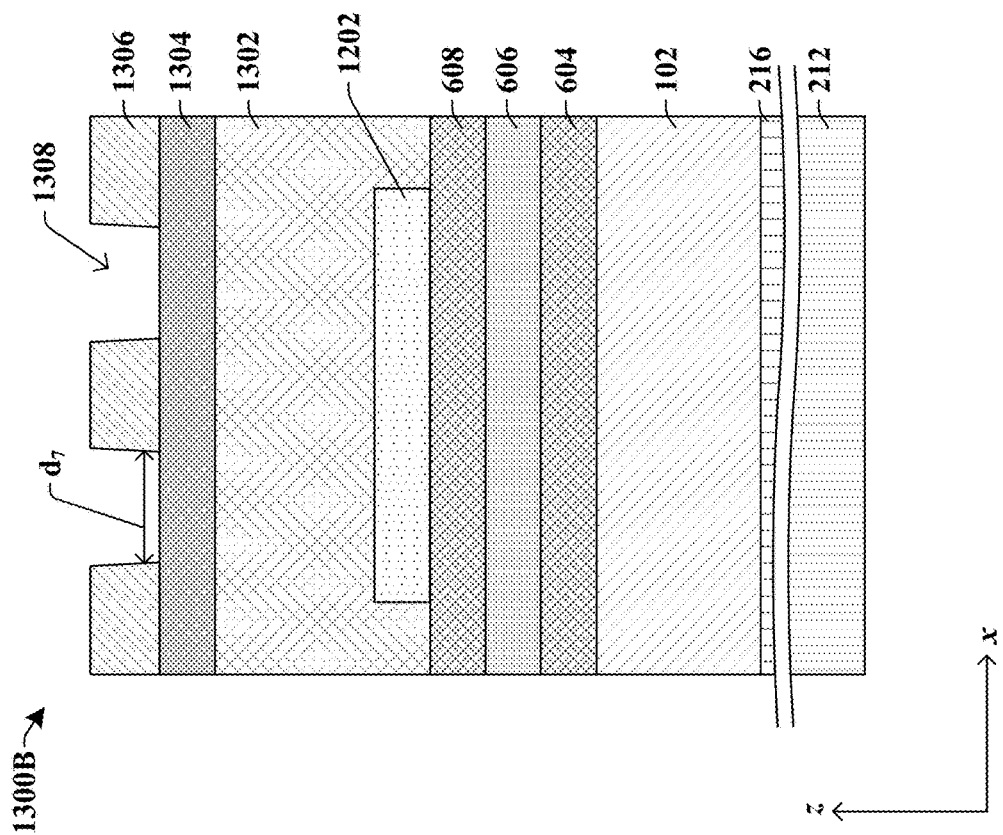
Figure 13A:
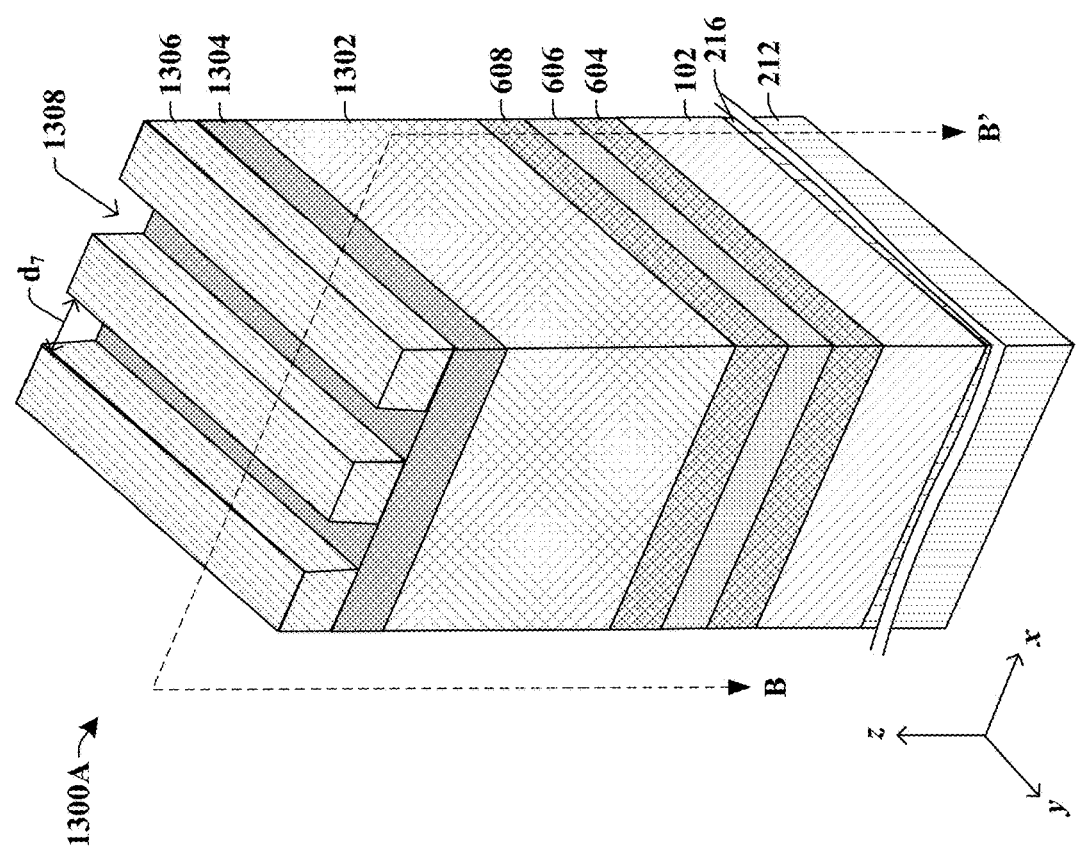

As shown in perspective view 1300A of FIG. 13A and in cross-sectional view 1300B of FIG. 13B, in some embodiments, a second patterning layer 1302 is formed over the patterned fourth hard mask layer 1202 and the third hard mask layer 608. In some embodiments, prior to forming the second patterning layer 1302, the second masking structure (1102 of FIG. 12) is selectively removed from the patterned fourth hard mask layer 1202, whereas in some other embodiments, the second masking structure (1102 of FIG. 12) may not be removed and thus, may be arranged between the second patterning layer 1302 and the patterned fourth hard mask layer 1202. In some embodiments, the second patterning layer 1302 is formed by way of a spin-on process. In some embodiments, the second patterning layer 1302 comprises, for example, carbon, silicon carbide, or the like.

In some embodiments, a second anti-reflective layer 1304 is formed over the second patterning layer 1302. In some embodiments, the second anti-reflective layer 1304 may be formed by way of a deposition process (e.g., PVD, CVD, ALD, spin-on, etc.). In some embodiments, the second anti-reflective layer 1304 may comprise, for example, silicon oxygen carbide, silicon, silicon oxynitride, titanium oxide, or the like. In some embodiments, a third masking structure 1306 is formed over the second anti-reflective layer 1304. In some embodiments, BARC layer (not shown) may be arranged directly between the third masking structure 1306 and the second anti-reflective layer 1304. In some embodiments, the third masking structure 1306 comprises a photoresist material patterning by deposition (e.g., PVD, CVD, ALD, spin-on, etc.), lithography (e.g., extreme UV lithography) and removal processes (e.g., etching). In some embodiments, the third masking structure 1306 comprises third openings 1308 that have a width equal seventh distance $d_7$ measured in the x-direction. In some embodiments, as shown in FIG. 13B, the third openings 1308 of the third masking structure 1306 directly overlie the patterned fourth hard mask layer 1202. In some embodiments, the third openings 1308 of the third masking structure 1306 are elongated in the y-direction.

Figure 14C:
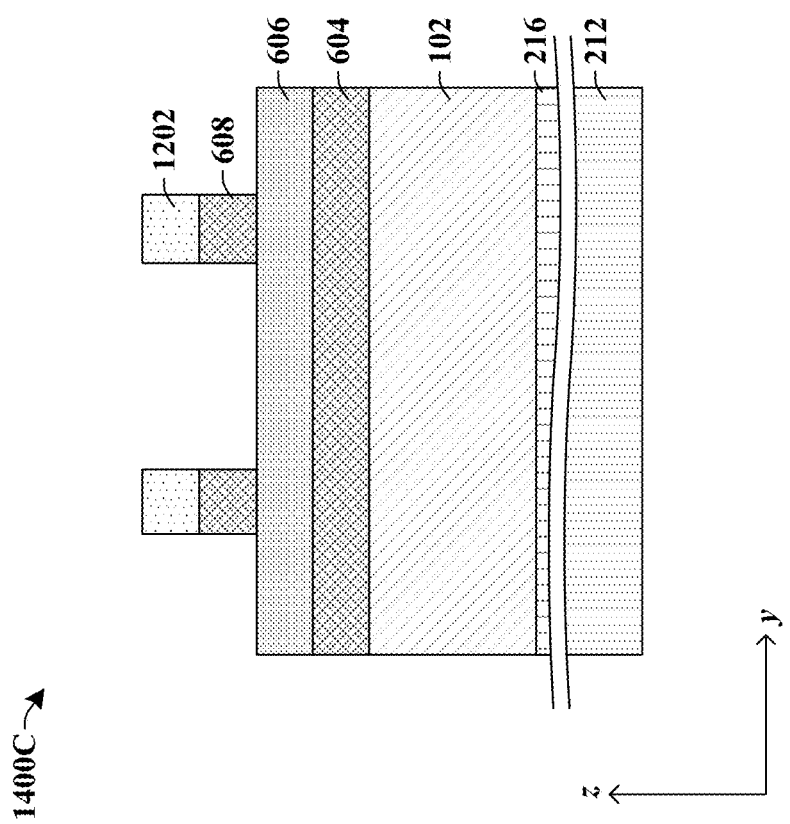

As shown in perspective view 1400A of FIG. 14A, in cross-sectional view 1400B of FIG. 14B, and in cross-sectional view 1400C of FIG. 14C, in some embodiments, a removal process is performed to remove portions of the second anti-reflective layer 1304, the second patterning layer 1302, and the third hard mask layer 608 according to the third openings 1308 of the third masking structure 1306. In some embodiments, the removal process of FIG. 14A may comprise multiple etchants to remove each material of the second anti-reflective layer 1304, the second patterning layer 1302, and the third hard mask layer 608. In some embodiments, the removal process of FIG. 14A utilizes a fluoride-based etchant to remove the portions of the third hard mask layer 608 such as, for example, $CF_4$, $CHF_3$, $C_4F_6$, $C_4F_8$, or the like.

In some embodiments, the removal process of FIG. 14A is also performed according to the patterned fourth hard mask layer 1202. Thus, in some embodiments, the patterned fourth hard mask layer 1202, which is arranged directly over the third hard mask layer 608, acts as a masking structure to prevent portions of the third hard mask layer 608 from being removed by the removal process of FIG. 14A. In some embodiments, the patterned fourth hard mask layer 1202 has a slower rate of removal by the etchant utilized to remove the portions of the third hard mask layer 608, whereas in some other embodiments, the patterned fourth hard mask layer 1202 is substantially resistant to removal by the etchant utilized to remove the portions of the third hard mask layer 608.

It will be appreciated that the second patterning layer 1302 of FIG. 14A is illustrated as somewhat transparent in order to see the patterned fourth hard mask layer 1202 acting as a masking structure for the third hard mask layer 608. Further, in some embodiments, upper portions of the patterned fourth hard mask layer 1202 that are arranged directly below the third openings 1308 of the third masking structure 1306 may be partially removed due to the removal process of FIG. 14A. In some other embodiments, the patterned fourth hard mask layer 1202 is not removed by the removal process of FIG. 14A. Nevertheless, in some embodiments, the third hard mask layer 608 is patterned according to the third masking structure 1306 and the patterned fourth hard mask layer 1202 in FIGS. 14A, 14B, and 14C.

As shown in perspective view 1500A of FIG. 15A and in cross-sectional view 1500B of FIG. 15B, in some embodiments, the third masking structure (1306 of FIG. 14A), the second anti-reflective layer (1304 of FIG. 14A), the second patterning layer (1302 of FIG. 14A), and the patterned fourth hard mask layer (1202 of FIG. 14A) are removed from the third hard mask layer 608. In some embodiments, the third hard mask layer 608 comprises fourth openings 1502 that have a width measured in the x-direction equal to a ninth distance $d_9$ and are spaced apart from one another in the y-direction by an eighth distance $d_8$.

In some embodiments, the ninth distance $d_9$ may be less than the seventh distance ($d_7$ of FIG. 13A) of the third openings (1308 of FIG. 13A) of the third masking structure (1306 of FIG. 13A) because of residual effects of the removal process of FIG. 14A that reduces dimensions of the pattern transferred from the third masking structure (1306 of FIG. 14A) to the third hard mask layer 608. Similarly, in some embodiments, the eighth distance $d_8$ may be less than the sixth distance $d_6$ because of residual effects of the removal process of FIG. 14A that reduces dimensions of the pattern transferred from the patterned fourth hard mask layer (1202 of FIG. 14A) to the third hard mask layer 608.

In some embodiments, the second hard mask layer 606 is patterned according to the fourth openings 1502 of the third hard mask layer 608 such that the fourth openings 1502 also extend through the second hard mask layer 606. In some embodiments, an etching process comprising a wet or dry etchant such as, for example, chlorine, methane, nitrogen gas, or hydrobromic acid is used to remove portions of the second hard mask layer 606 that are not covered by the third hard mask layer 608. In some such embodiments, the third hard mask layer 608 and the first hard mask layer 604 may be substantially resistant to removal by the etchant used to remove the portions of the second hard mask layer 606 in FIG. 15A.

As shown in perspective view 1600A of FIG. 16A and in cross-sectional view 1600B of FIG. 16B, in some embodiments, the holes 1602 are formed that extend through the first hard mask layer 604, the interconnect dielectric layer 102, and the etch stop layer 216. In some embodiments, the holes 1602 are formed by way of a patterning process (e.g., lithography, etching) according to a masking structure (not shown). In some embodiments, the holes 1602 expose a contact via (e.g., 210 of FIG. 2) arranged below the etch stop layer 216 that is coupled to some underlying semiconductor device. In some embodiments, the holes 1602 have a width measured in the x-direction that is smaller than the ninth distance $d_9$.

As shown in perspective view 1700A of FIG. 17A and in cross-sectional view 1700B of FIG. 17B, in some embodiments, a removal process is performed to pattern the first hard mask layer 604 and the interconnect dielectric layer 102 according to the third hard mask layer 608 such that the fourth openings 1502 of the third hard mask layer 608 extend through the first hard mask layer 604 and partway through the interconnect dielectric layer 102. In some embodiments, the removal process of FIG. 17A utilizes a first etchant to remove portions of the first hard mask layer 604, and a second etchant different than the first etchant to remove portions of the interconnect dielectric layer 102. In some other embodiments, a same etchant is used to remove portions of the first hard mask layer 604 and of the interconnect dielectric layer 102. In some embodiments, the removal process of FIG. 17A utilizes a fluoride-based etchant to remove the portions of the first hard mask layer 604 such as, for example, $CF_4$, $CHF_3$, $C_4F_6$, $C_4F_8$, or the like. In some embodiments, the removal process of FIG. 17A is controlled by an etching time such that the fourth openings 1502 have lower surfaces 1502L that are defined by the interconnect dielectric layer 102 and that are arranged between the first hard mask layer 604 and the etch stop layer 216.

In some embodiments, due to residual etching effects, the fourth openings 1502 may have a width, measured in the x-direction, that decreases as the width is measured from the third hard mask layer 608 to the lower surfaces 1502L in the z-direction. In other words, in some embodiments, the removal process of FIG. 17A causes the sidewalls of the fourth openings 1502 within the interconnect dielectric layer 102 to be slanted, thereby decreasing the width of the fourth openings 1502 within the interconnect dielectric layer 102. Thus, in some embodiments, as more layers are etched, the dimensions of openings formed in lower layers may be reduced due to residual etching effects.

Thus, in some embodiments, the fourth openings 1502 extend through the interconnect dielectric layer 102 may have a width equal to a second distance $d_2$ that is less than the ninth distance $d_9$ of the third hard mask layer 608. In some embodiments, the fourth openings 1502 may be spaced apart from one another in the x-direction by a fourth distance $d_4$.

As shown in perspective view 1800A of FIG. 18A and in cross-sectional view 1800B of FIG. 18B, in some embodiments, interconnect vias 218 are formed within the holes (1602 of FIG. 17B) of the interconnect dielectric layer 102, and interconnect wires 104 are formed within the fourth openings (1502 of FIG. 17B) of the interconnect dielectric layer 102. Further, in some embodiments, the first, second, and third hard mask layers 604, 606, 608 may be removed from the interconnect dielectric layer 102 by way of a removal process such as an etching process or a planarization process such as CMP. In some embodiments, the interconnect vias 218 and the interconnect wires 104 may be formed by depositing a conductive material within the holes (1602 of FIG. 17B) and the fourth openings (1502 of FIG. 17B) of the interconnect dielectric layer 102. Then, in some embodiments, any excess conductive material that is formed over the interconnect dielectric layer 102 may be removed by a planarization process, such as CMP, for example. In some embodiments, the interconnect wires 104 and the interconnect vias 218 comprise a same conductive material such as, for example, aluminum, titanium, tantalum, tungsten, copper, or the like. In some other embodiments, interconnect barrier and/or liner layers may be formed along outer sidewalls of the holes (1602 of FIG. 17B) and the fourth openings (1502 of FIG. 17B) of the interconnect dielectric layer 102 prior to the deposition of the conductive material.

In some embodiments, the interconnect vias 218 may be coupled to various semiconductor devices arranged within or over the substrate 212 (e.g., FIG. 2). In some embodiments, the interconnect vias 218, the interconnect wires 104, and the interconnect dielectric layer 102 form an interconnect structure that provides a network of pathways for signals (e.g., current, voltage) to travel between various devices arranged over the substrate 212 and above or below the interconnect structure.

In some embodiments, the interconnect wires 104 have outer sidewalls that are coupled to one another by substantially rounded corner sidewalls 106. Further, in some embodiments, first outermost sidewalls 104f of the interconnect wires 104 that are substantially normal to the y-direction may be substantially flat and parallel with one another because they were formed based on the patterned fourth hard mask layer (1202 of FIG. 12) extending in the x-direction.

In some embodiments, the interconnect wires 104 have dimensions that are less than the limited dimensions achievable through lithography alone because of the multiple masking structures and the multiple removal processes (e.g., etching) used to form the fourth openings (1502 of FIG. 17B) in the interconnect dielectric layer 102. For example, in some embodiments, the interconnect wires 104 have a width measured in the x-direction that is equal to a second distance $d_2$ that may be in a range of between approximately 10 nanometers and approximately 25 nanometers. In some embodiments, the interconnect wires 104 are spaced apart from one another in the x-direction by the fourth distance $d_4$ that may be in a range of between, for example, approximately 10 nanometers and approximately 25 nanometers.

In some embodiments, the interconnect wires 104 may have a length measured in the y-direction that is equal to a first distance $d_1$ that may be in a range of between, for example, approximately 8 nanometers and approximately 109 nanometers. In some embodiments, the interconnect wires 104 may be spaced apart from one another in the y-direction by a third distance $d_1$ that may be in a range of between approximately 8 nanometers and approximately 20 nanometers. For example, in some embodiments, the third distance $d_3$ is less than or equal to 12 nanometers. In some embodiments, the third distance $d_3$ is reduced by about 10 to 15 percent compared to other methods that do not use the patterned fourth hard mask layer (1202 of FIG. 12) and thus, is less than or equal to about 12 nanometers. Thus, the method disclosed in FIGS. 5-18B and variations thereof may be used to form interconnect wires 104 that are arranged closely to one another to increase the overall device density of the integrated chip on the substrate 212.

Figure 19:
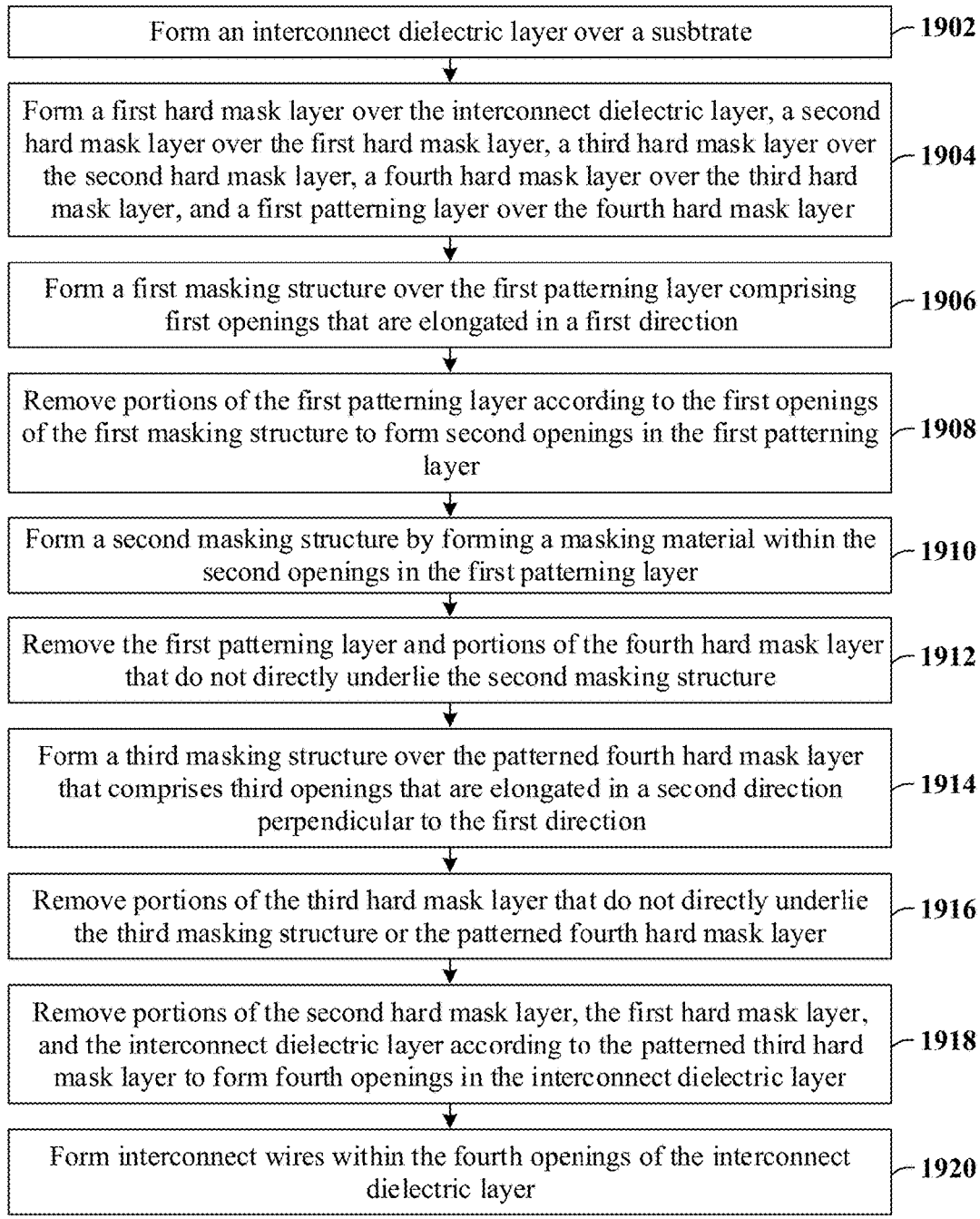
FIG. 19 illustrates a flow diagram of some embodiments of a method corresponding to the method illustrated in FIGS. 5-18B.

FIG. 19 illustrates a flow diagram of some embodiments of a method 1900 corresponding to the method of FIGS. 5-18B.

While method 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, an interconnect dielectric layer is formed over a substrate. FIG. 5 illustrates a cross-sectional view 500 of some embodiments corresponding to act 1902.

At act 1904, a first hard mask layer is formed over the interconnect dielectric layer; a second hard mask layer is formed over the first hard mask layer; a third hard mask layer is formed over the second hard mask layer; a fourth hard mask layer is formed over the third hard mask layer; and a first patterning layer is formed over the fourth hard mask layer. FIGS. 6 and 7 illustrate cross-sectional views 600 and 700, respectively, of some embodiments corresponding to act 1904.

At act 1906, a first masking structure is formed over the first patterning layer comprising first openings that are elongated in a first direction. FIG. 8A illustrates a perspective view 800A of some embodiments corresponding to act 1906.

At act 1908, portions of the first patterning layer are removed according to the first openings of the first masking structure to form second openings in the first patterning layer. FIG. 9A illustrates a perspective view 900A of some embodiments corresponding to act 1908.

At act 1910, a second masking structure is formed by forming a masking material within the second openings in the first patterning layer. FIG. 11A illustrates a perspective view 1100A of some embodiments corresponding to act 1910.

At act 1912, the first patterning layer and portions of the fourth hard mask layer that do not directly underlie the second masking structure are removed. FIG. 12 illustrates a perspective view 1200 of some embodiments corresponding to act 1912.

At act 1914, a third masking structure is formed over the patterned fourth hard mask layer and comprises third openings that are elongated in a second direction perpendicular to the first direction. FIG. 13A illustrates a perspective view 1300A of some embodiments corresponding to act 1914.

At act 1916, portions of the third hard mask layer that do not directly underlie the third masking structure or the patterned fourth hard mask layer are removed. FIG. 14A illustrates a perspective view 1400A of some embodiments corresponding to act 1916.

At act 1918, portions of the second hard mask layer, the first hard mask layer, and the interconnect dielectric layer are removed according to the patterned third hard mask layer to form fourth openings in the interconnect dielectric layer. FIG. 17A illustrates a perspective view 1700A of some embodiments corresponding to act 1918.

At act 1920, interconnect wires are formed within the fourth openings of the interconnect dielectric layer. FIG. 18A illustrates a perspective view 1800A of some embodiments corresponding to act 1920.

Therefore, the present disclosure relates to a method of using multiple masking structures extending in first and second directions and multiple etching processes to pattern an interconnect dielectric layer to reduce the spacing between interconnect wires formed within the patterned interconnect dielectric layer.

Accordingly, in some embodiments, the present disclosure relates to a method comprising: forming an interconnect dielectric layer arranged over a substrate; depositing multiple hard mask layers over the interconnect dielectric layer; depositing a first patterning layer over the multiple hard mask layers; forming a first masking structure over the first patterning layer, wherein openings in the first masking structure are formed by way of a first extreme ultraviolet (EUV) lithography process; removing portions of the first patterning layer according to the first masking structure; forming a second masking structure within the patterned first patterning layer; patterning a topmost one of the hard mask layers according to the second masking structure; forming a third masking structure over the topmost one of the hard mask layers, wherein openings in the third masking structure are formed by way of a second EUV lithography process; performing removal processes to pattern the multiple hard mask layers and form openings in the interconnect dielectric layer; and forming interconnect wires within the openings of the interconnect dielectric layer, wherein a first interconnect wire extends from an upper surface of the interconnect dielectric layer and towards the substrate in a first direction to contact an interconnect via, wherein first outermost sidewalls of the first interconnect wire are parallel to one another and normal to a second direction perpendicular to the first direction, wherein second outermost sidewalls of the first interconnect wire are parallel to one another and normal to a third direction perpendicular to the first and second directions, and wherein rounded corners couple the first outermost sidewalls to the second outermost sidewalls.

In other embodiments, the present disclosure relates to a method comprising: forming an interconnect dielectric layer arranged over a substrate; depositing multiple hard mask layers over the interconnect dielectric layer; depositing a first patterning layer over the multiple hard mask layers; forming a first masking structure over the first patterning layer by way of a first extreme ultraviolet (EUV) lithography process; removing portions of the first patterning layer according to the first masking structure; forming a second masking structure within the patterned first patterning layer; patterning a topmost one of the hard mask layers according to the second masking structure; forming a second patterning layer over the topmost one of the hard mask layers; forming a third masking structure over the second patterning layer by way of a second EUV lithography process; removing portions of the second patterning layer and the multiple hard mask layers according to the third masking structure and the topmost one of the hard mask layers to form openings in the interconnect dielectric layer; and forming interconnect wires within the openings of the interconnect dielectric layer, wherein a first interconnect wire and a second interconnect wire extend through the interconnect dielectric layer in a first direction, wherein first outermost sidewalls of the first interconnect wire are spaced apart from one another by a first distance in a second direction perpendicular to the first direction, wherein second outermost sidewalls of the first interconnect wire are spaced apart from one another by a second distance in a third direction perpendicular to the first and second directions, wherein the first distance is greater than the second distance, and wherein the first interconnect wire is spaced apart from the second interconnect wire in the second direction by a third distance that is less than or equal to the second distance.

In yet other embodiments, the present disclosure relates to a method comprising: forming an interconnect dielectric layer over a substrate; forming a first hard mask layer over the interconnect dielectric layer, a second hard mask layer over the first hard mask layer, a third hard mask layer over the second hard mask layer, a fourth hard mask layer over the third hard mask layer, and a first patterning layer over the fourth hard mask layer; forming a first masking structure over the first patterning layer comprising first openings that are elongated in a first direction; removing portions of the first patterning layer according to the first openings of the first masking structure to form second openings in the first patterning layer; forming a second masking structure by forming a masking material within the second openings in the first patterning layer; removing the first patterning layer and portions of the fourth hard mask layer that do not directly underlie the second masking structure; forming a third masking structure over the patterned fourth hard mask layer that comprises third openings that are elongated in a second direction perpendicular to the first direction; removing portions of the third hard mask layer that do not directly underlie the third masking structure or the patterned fourth hard mask layer; removing portions of the second hard mask layer, the first hard mask layer, and the interconnect dielectric layer according to the patterned third hard mask layer to form fourth openings in the interconnect dielectric layer; and forming interconnect wires within the fourth openings of the interconnect dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a hard mask layer over an interconnect dielectric layer;
   depositing a patterning layer over the hard mask layer;
   forming a mask structure inset into the patterning layer and comprising a cut pattern;
   performing an etch into the hard mask layer with the mask structure in place to pattern the hard mask layer with the cut pattern;

forming an additional mask structure overlying the patterned hard mask layer and comprising a line pattern, which comprises line-shaped openings elongated in parallel;
transferring the cut pattern and the line pattern concurrently to the interconnect dielectric layer from the patterned hard mask layer and the additional mask structure to form cut line-shaped openings elongated in parallel; and
forming conductive wires respectively in the cut line-shaped openings;
wherein the cut line-shaped openings correspond to the line-shaped openings and have cuts matching the cut pattern.

2. The method according to claim 1, wherein the line-shaped openings and the cut line-shaped openings have greatest dimensions in a first direction, and wherein the cuts extend across the cut line-shaped openings in a second direction transverse to the first direction.

3. The method according to claim 1, wherein the cut pattern comprises line-shaped segments elongated in parallel in a first direction transverse to a second direction along which the line-shaped openings are elongated.

4. The method according to claim 1, further comprising:
patterning the patterning layer using an extreme ultraviolet (EUV) lithography process to form mask openings with the cut pattern in the patterning layer, wherein the mask structure is formed filling the mask openings.

5. The method according to claim 1, wherein the additional mask structure is formed by an extreme ultraviolet (EUV) lithography process.

6. The method according to claim 1, further comprising:
forming conductive vias in the interconnect dielectric layer, wherein the conductive wires are formed overlapping respectively with the conductive vias.

7. The method according to claim 1, further comprising:
depositing an additional hard mask layer over the interconnect dielectric layer, wherein the hard mask layer is deposited over the additional hard mask layer;
transferring the cut pattern and the line pattern concurrently to the additional hard mask layer to form the cut line-shaped openings in the additional hard mask layer;
forming via openings extending into the interconnect dielectric layer through the cut line-shaped openings; and
after the forming of the via openings, extending the cut line-shaped openings to the interconnect dielectric layer to transfer the cut pattern and the line pattern concurrently to the interconnect dielectric layer.

8. A method comprising:
depositing a hard mask layer over an interconnect dielectric layer;
patterning the hard mask layer into a patterned hard mask layer comprising a line-shaped segment elongated laterally in a first direction;
after the patterning, forming a mask structure comprising a pair of line-shaped segments elongated laterally in parallel in a second direction transverse to the first direction and overlapping with the line-shaped segment of the patterned hard mask layer;
removing portions of the interconnect dielectric layer according to the mask structure and the patterned hard mask layer to form a pair of openings elongated in the second direction and arranged in a line extending in the second direction; and
forming a pair of conductive wires bordering and respectively filling the pair of openings;
wherein the pair of openings are separated from each other by a portion of the interconnect dielectric layer, which underlies the line-shaped segment of the patterned hard mask layer at completion of the patterning.

9. The method according to claim 8, wherein the pair of conductive wires are spaced from each other by a spacing and comprise a first conductive wire, and wherein the first conductive wire has a width extending in the first direction that is greater than or equal to the spacing.

10. The method according to claim 8, further comprising:
depositing a patterning layer over the hard mask layer;
forming a first additional mask structure over the patterning layer;
performing an etch into the patterning layer with the first additional mask structure in place to form mask openings;
forming a second additional mask structure in the mask openings; and
performing an additional etch into the hard mask layer with the second additional mask structure in place to pattern the hard mask layer into the patterned hard mask layer.

11. The method according to claim 8, further comprising:
depositing an additional hard mask layer over the interconnect dielectric layer, wherein the hard mask layer is deposited over the additional hard mask layer;
performing an etch into the additional hard mask layer with the mask structure and the patterned hard mask layer in place to form the pair of openings in the additional hard mask layer; and
extending the pair of openings into the interconnect dielectric layer after the etch to remove the portions of the interconnect dielectric layer.

12. The method according to claim 11, further comprising:
removing the mask structure between the performing of the etch and the extending.

13. The method according to claim 8, wherein the patterned hard mask layer comprises an additional line-shaped segment elongated laterally in parallel in the first direction with the line-shaped segment of the patterned hard mask layer, and wherein the pair of line-shaped segments of the mask structure overlap with the additional line-shaped segment of the patterned hard mask layer.

14. A method comprising:
forming a patterned hard mask layer overlying an interconnect dielectric layer and comprising a line-shaped segment with a greatest dimension in a first direction;
forming a mask structure overlying the patterned hard mask layer and comprising a line-shaped opening, which overlies the line-shaped segment and has a greatest dimension in a second direction transverse to the first direction;
patterning the interconnect dielectric layer according to the mask structure and the patterned hard mask layer to form a cut line-shaped opening having a first opening segment and a second opening segment spaced from each other in the second direction; and
forming a first wire and a second wire respectively in the first opening segment and the second opening segment, wherein the first wire and the second wire have opposing sidewalls facing each other and extending in parallel, and further have rounded corners at edges of the opposing sidewalls when viewed top down.

15. The method according to claim 14, wherein the first wire has first outermost sidewalls extending in parallel in the first direction, second outermost sidewalls extending in parallel in the second direction, and rounded corners coupling the first outermost sidewalls to the second outermost sidewalls.

16. The method according to claim 14, wherein the first wire and the second wire border in the second direction with a separation and have individual dimensions in the first and second directions that are greater than the separation.

17. The method according to claim 14, further comprising:
depositing an additional hard mask layer over the interconnect dielectric layer, wherein the patterned hard mask layer is formed over the additional hard mask layer;
patterning the additional hard mask layer according to the mask structure and the patterned hard mask layer to form the cut line-shaped opening in the additional hard mask layer; and
extending the cut line-shaped opening from the additional hard mask layer to the interconnect dielectric layer after the patterning of the additional hard mask layer.

18. The method according to claim 17, wherein the line-shaped opening of the mask structure covers the cut line-shaped opening at completion of the patterning of the additional hard mask layer.

19. The method according to claim 17, wherein the line-shaped segment of the patterned hard mask layer covers a portion of the additional hard mask layer separating the first opening segment from the second opening segment at completion of the patterning of the additional hard mask layer.

20. The method according to claim 14, further comprising:
depositing a hard mask layer over the interconnect dielectric layer;
depositing a patterning layer over the hard mask layer;
forming a first additional mask structure on the patterning layer by photolithography;
transferring a pattern from the first additional mask structure to the patterning layer to form mask openings in the patterning layer;
forming a second additional mask structure in the mask openings;
removing the patterning layer; and
performing an etch into the hard mask layer with the second additional mask structure in place to form the patterned hard mask layer.

* * * * *